United States Patent
Watanabe et al.

(10) Patent No.: US 7,776,656 B2
(45) Date of Patent: Aug. 17, 2010

(54) METHOD FOR MANUFACTURING SEMICONDUCTOR DEVICE

(75) Inventors: Ryosuke Watanabe, Isehara (JP); Daiki Yamada, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 945 days.

(21) Appl. No.: 11/491,037

(22) Filed: Jul. 24, 2006

(65) Prior Publication Data

US 2007/0045805 A1 Mar. 1, 2007

(30) Foreign Application Priority Data

Jul. 29, 2005 (JP) ............................. 2005-221140

(51) Int. Cl.
*H01L 21/00* (2006.01)
(52) U.S. Cl. ............... 438/118; 438/114; 257/E21.502; 257/E21.505
(58) Field of Classification Search ............... 438/14, 438/15, 22–24, 33, 51, 55, 64, 106, 110, 438/112, 113, 114, 118, 124–127, 463, 464; 257/E51.018, E51.02, E21.502, E31.117, 257/E21.505
See application file for complete search history.

(56) References Cited

U.S. PATENT DOCUMENTS

| | | | |
|---|---|---|---|
| 6,671,030 B2 * | 12/2003 | Gyoda | 349/190 |
| 6,709,795 B2 * | 3/2004 | Farnworth et al. | 430/18 |
| 6,736,918 B1 * | 5/2004 | Ichikawa et al. | 156/182 |
| 2003/0140485 A1 * | 7/2003 | Yamazaki et al. | 29/740 |
| 2005/0148121 A1 * | 7/2005 | Yamazaki et al. | 438/149 |
| 2006/0055014 A1 | 3/2006 | Tsurume et al. | |
| 2009/0110882 A1 * | 4/2009 | Higuchi | 428/138 |

FOREIGN PATENT DOCUMENTS

| | | |
|---|---|---|
| EP | 1 130 542 | 9/2001 |
| JP | 2001-063256 | 3/2001 |
| JP | 2003-016405 | 1/2003 |
| WO | WO 2005/119781 | 12/2005 |

\* cited by examiner

*Primary Examiner*—Caridad M Everhart
(74) *Attorney, Agent, or Firm*—Eric J. Robinson; Robinson Intellectual Property Law Office, P.C.

(57) ABSTRACT

A semiconductor device which is excellent in chemical and physical strength and circumstance resistance is provided. A first stacked film including a first base material and a first adhesive layer is adhered so as to cover one surface of a stacked body including an integrated circuit, the stacked body is sealed by adhering a second stacked film including a second base material and a second adhesive layer so as to cover the other surface of the stacked body, and the first stacked film and the second stacked film are cut. Then, a side surface of the first stacked film and the second stacked film, which is exposed by the cutting, is irradiated with laser light.

15 Claims, 14 Drawing Sheets

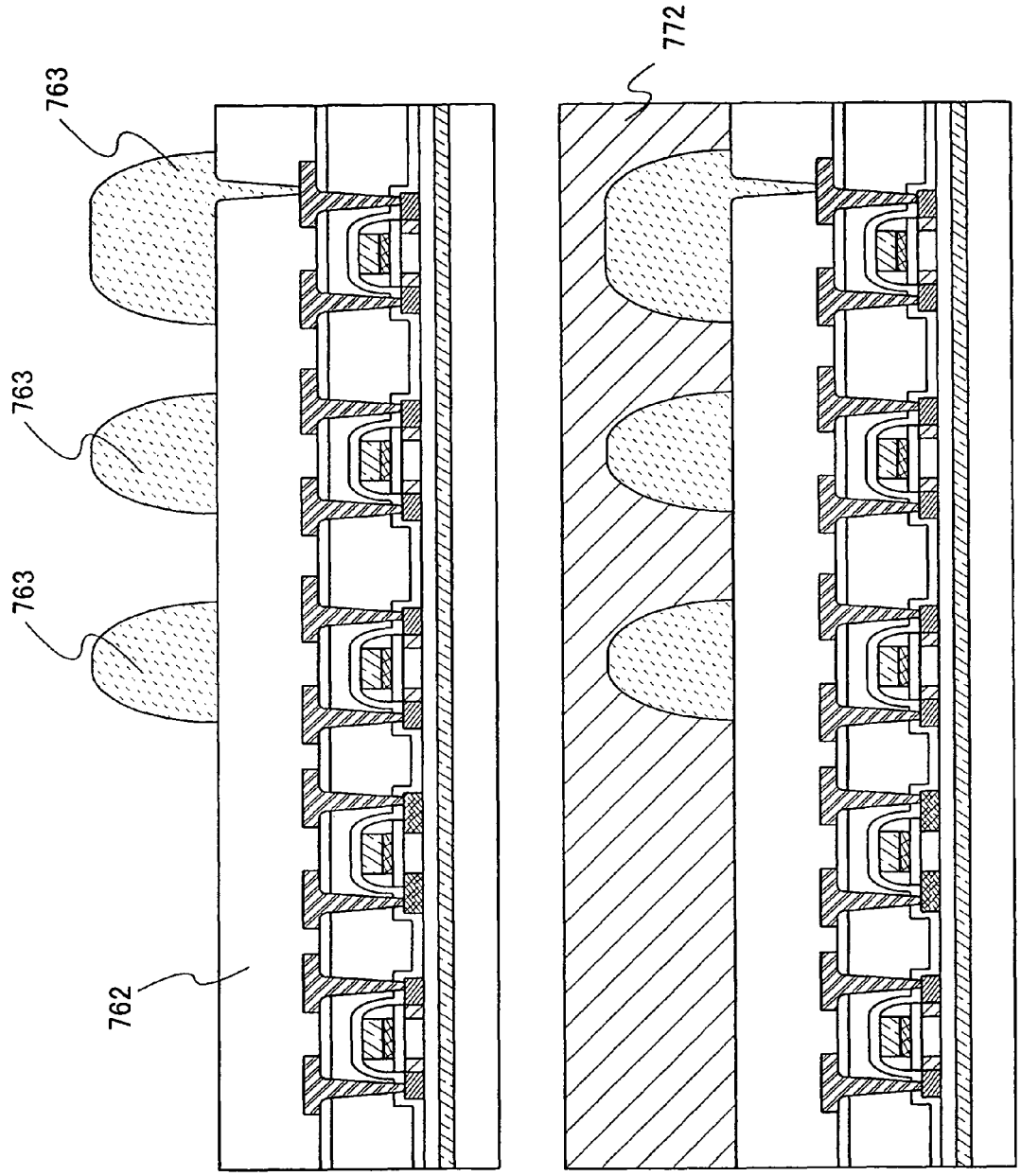

METHOD FOR MANUFACTURING SEMICONDUCTOR DEVICE

BACKGROUND OF THE INVENTION

1. Field of the Invention

The present invention disclosed in this specification relates to a semiconductor device and a manufacturing method thereof. In particular, the present invention relates to a semiconductor device capable of transmitting and receiving data with wireless communication and a manufacturing method thereof.

2. Description of the Related Art

In recent years, a semiconductor device capable of transmitting and receiving data with wireless communication has been actively developed. Such a semiconductor device is called an IC tag, an ID tag, an RF (Radio Frequency) tag, an RFID (Radio Frequency Identification) tag, a wireless tag, an electronic tag, a wireless processor, a wireless memory, a wireless chip, or the like. Hereinafter, a semiconductor device capable of transmitting and receiving data with wireless communication may be referred to as "an RFID tag".

An RFID tag includes an antenna and an integrated circuit (an IC chip). One of objects of an RFID tag is improvement in reliability.

In order to accomplish the improvement in reliability, there is a method of sealing both surfaces of a substrate on which components such as an IC chip, a condenser, and an antenna coil are mounted by using a sheet member (Reference 1: Japanese Patent Application Laid-Open No: 2001-63256). A distance between each surface of the substrate and the sheet member is controlled to be a constant distance by using adhesive, and thus, concavity and convexity of the components are not observed on the surface. As a result, breakdown in a portion having concavity and convexity is suppressed, and reliability of an IC card is improved.

In the above described method, adhesive is used when the substrate on which the IC chip is mounted and the sheet member are attached to each other. In other words, there is an adhesive layer between the substrate on which the IC chip is mounted and the sheet member. The adhesive layer is formed of a material having fluidity before curing and adhesion and viscosity after curing. Specifically, hot-melt adhesive or ionizing radiation (such as ultraviolet ray or electron beam)-curable adhesive is used. Such adhesive usually has a low moisture proof property. In addition, the adhesive layer is melted under conditions of a high temperature and high humidity in some cases, and there is a possibility that the mounted substrate is infiltrated from a melted portion. Therefore, it is necessary to develop a semiconductor device which is not only excellent in chemical and physical strength but also in circumstance resistance.

SUMMARY OF THE INVENTION

In view of the above problems, it is an object of the present invention to provide a semiconductor device which is excellent in chemical and physical strength and circumstance resistance.

According to one feature of the present invention, a method for manufacturing a semiconductor device includes the steps of adhering a first stacked film including a first base material and a first adhesive layer so as to cover one surface of a stacked body including an integrated circuit, sealing the stacked body by adhering a second stacked film including a second base material and a second adhesive layer so as to cover the other surface of the stacked body, and cutting the first stacked film and the second stacked film, where a cross-section (side surface) of the first stacked film and the second stacked film, which is exposed by the cutting, is irradiated with laser light.

According to another feature of the present invention, a method for manufacturing a semiconductor device includes the steps of forming a peeling layer over a substrate, forming an element layer including a plurality of integrated circuits over the peeling layer, forming an insulating film over the element layer, forming an opening by removing part of the element layer and the insulating film at the same time as forming a stacked body including part of the element layer and the insulating film, peeling the stacked body from the substrate, adhering a first stacked film including a first base material and a first adhesive layer so as to cover one surface of the peeled stacked body, sealing the stacked body by adhering a second stacked film including a second base material and a second adhesive layer so as to cover the other surface of the peeled stacked body, and cutting the first stacked film and the second stacked film, where a cross-section (side surface) of the first stacked film and the second stacked film, which is exposed by the cutting, is irradiated with laser light.

According to another feature of the present invention, a method for manufacturing a semiconductor device includes the steps of forming an element layer including a plurality of integrated circuits over one surface of a substrate; grinding the other surface of the substrate; polishing the other surface of the substrate, which is ground; forming a stacked body including an integrated circuit by cutting the polished substrate and the element layer; adhering a first stacked film including a first base material and a first adhesive layer so as to cover one surface of the stacked body; sealing the stacked body by adhering a second stacked film including a second base material and a second adhesive layer so as to cover the other surface of the stacked body; and cutting the first stacked film and the second stacked film, where a cross-section (side surface) of the first stacked film and the second stacked film, which is exposed by the cutting, is irradiated with laser light.

In addition, in the above structure, a thickness of the polished substrate is 2 µm or more and 50 µm or less.

In addition, in the above structure, a cross-section (side surface) of the first stacked film and the second stacked film, which is exposed by the cutting, is irradiated with laser light at an incident angle of 30° or more and 80° or less.

In addition, in the above structure, an ultraviolet (UV) laser, a $CO_2$ laser, or a YAG laser is used as the laser light.

In addition, in the above structure, since a cross-section (side surface) of the first stacked film and the second stacked film, which is exposed by the cutting, is irradiated with laser light, a cross-section (side surface) of the first adhesive layer and the second adhesive layer is sealed with the first base material and the second base material.

In addition, in the above structure, the stacked body has an antenna.

A stacked body including an integrated circuit is sealed with a first stacked film including a first base material and a first adhesive layer and a second stacked film including a second base material and a second adhesive layer, and the first stacked film and the second stacked film are cut. Then, a cross-section (side surface) of the first stacked film and the second stacked film, which is exposed by the cutting, is irradiated with laser light, and thus, the first base material and the second base material are adhered to each other. Since the adhesive layer is not exposed to the outside by laser light irradiation, moisture is prevented from being absorbed in a semiconductor device, and reliability of a semiconductor device can be improved. In addition, as a result, the yield of a semiconductor device can be improved, and a semiconductor device can be manufactured at lower cost.

BRIEF DESCRIPTION OF THE DRAWINGS

In the accompanying drawings:

FIGS. 8A and 8B are views each showing a manufacturing method of a semiconductor device according to the present invention (Embodiment 1);

DETAILED DESCRIPTION OF THE INVENTION

Figure 1A:
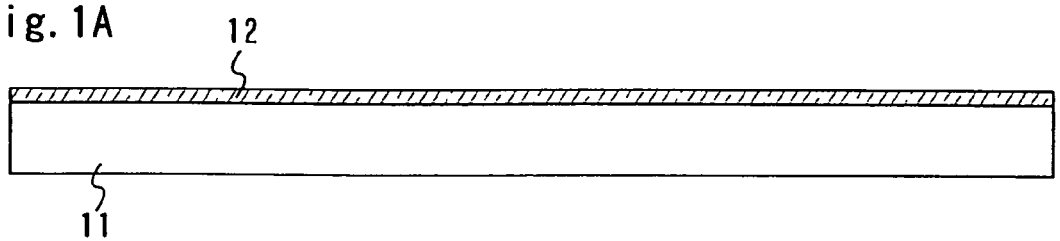
FIGS. 1A to 1D are views each showing a manufacturing method of a semiconductor device according to the present invention (Embodiment Mode 1)
Figure 1B:
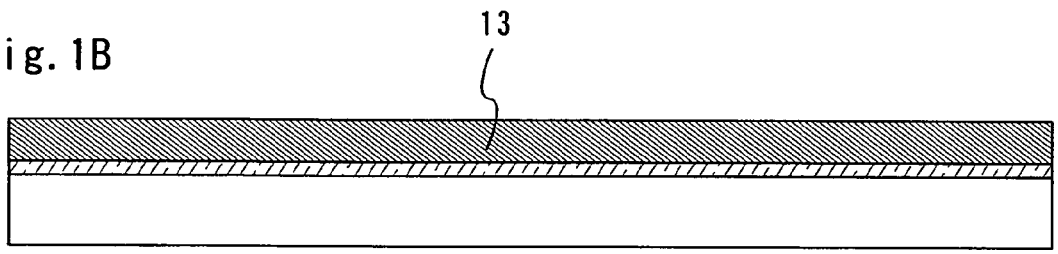

Embodiment modes of the present invention will be hereinafter explained with reference to the accompanying drawings. It is to be noted that the present invention is not limited to the following description, and it is easily understood by those skilled in the art that modes and details thereof can be modified in various ways without departing from the purpose and the scope of the invention. Therefore, the present invention should not be interpreted as being limited to the description of the embodiment modes and embodiments to be given below. Further, in a structure of the present invention, which will be described below, the same reference numerals are used for the same portions or portions having the same functions in different drawings.

Further, in the present specification, various conditions of materials and numerical values are described hereinafter; however, they are conditions of materials and numerical values of an object which is intended to be formed. It is easily understood by those skilled in the art that a slight difference may be generated in an element composition or a physical property value in an object that is actually formed. In addition, it is also easily understood by those skilled in the art that a result itself measured by various analyzing methods generally includes a slight difference. Therefore, the present invention should not be interpreted as being limited to the description of the embodiment modes and embodiments to be given below. Conditions of materials and numerical values which are slightly different from those described in the present specification are also regarded as being included in the scope of the present invention.

Embodiment Mode 1

In this embodiment mode, one method for manufacturing a semiconductor device of the present invention will be explained with reference to the drawings.

First, a peeling layer 12 is formed over a substrate 11 (FIG. 1A). An insulating film may be provided over the substrate 11 before forming the peeling layer 12. In particular, when contamination from the substrate is concerned, an insulating film is preferably formed between the substrate 11 and the peeling layer 12. The insulating film provided between the substrate 11 and the peeling layer 12 may have a single layer structure using a silicon oxide film (a SiOx film), a silicon nitride film (a SiNx film), a silicon oxide film containing nitrogen (a $SiO_xN_y$ film) (x>y) (x and y are positive integers), a silicon nitride film containing oxygen (a $SiN_xO_y$ film) (x>y) (x and y are positive integers), or the like, or a stacked layer structure of these films.

The substrate 11 can be a glass substrate, a quartz substrate, a silicon substrate (wafer), a metal substrate, a ceramic substrate, a stainless steel substrate, an acrylic substrate, or the like. In addition, the substrate 11 can be a plastic substrate having heat resistance, which can resist heat treatment in a manufacturing process of a semiconductor device. Among these substrates, a plastic substrate having heat resistance or a glass substrate is preferably used. A glass substrate has no particular limitations to an area or a shape thereof. Therefore, in a case of using a glass substrate as the substrate 11, a glass substrate which is one meter or more on one side and rectangular can be easily used, for example. Accordingly, productivity can be largely improved. This point is a great advantage compared with a case of using a circular silicon substrate. In addition, in terms of cost of a substrate itself, it is preferable to use a glass substrate instead of a quartz substrate, a silicon substrate, a metal substrate, a ceramic substrate, a stainless steel substrate, or the like. In particular, when upsizing of a substrate is desired, an advantage in cost is remarkably important and it is preferable to use a glass substrate also in consideration of mass-production. In this embodiment mode, a glass substrate is used as the substrate 11.

As a material for forming the peeling layer 12, an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the element as its main component can be used. Further, as a formation method, a sputtering method or various CVD methods such as a plasma CVD method can be used. In addition, a structure of the peeling layer 12 may be a single layer structure or a stacked layer structure. For example, it is preferable to have a structure in which, after forming a tungsten (W) film to have a thickness of 20 to 40 nm by a sputtering method, the surface of the tungsten (W) film is oxidized. As for a method for oxidizing the surface of the tungsten (W) film, the surface may be directly oxidized by plasma after forming the tungsten (W) film, or a silicon oxide film may be formed to be in contact with the tungsten (W) film after forming the tungsten (W) film. In the latter case, the surface of the tungsten (W) film is naturally oxidized when the silicon oxide film is formed, and a metal oxide film is formed. It is to be noted that oxide of tungsten is referred to as WOx where X is 2 to 3, and there are a case where X is 2 ($WO_2$), a case where X is 2.5 ($W_2O_5$), a case where X is 2.75 ($W_4O_{11}$), a case where X is 3 ($WO_3$), and the like. When oxide of tungsten is formed, the value of X as described above is not particularly limited, and a composition ratio may be determined based on an etching rate or the like.

Figure 11A:
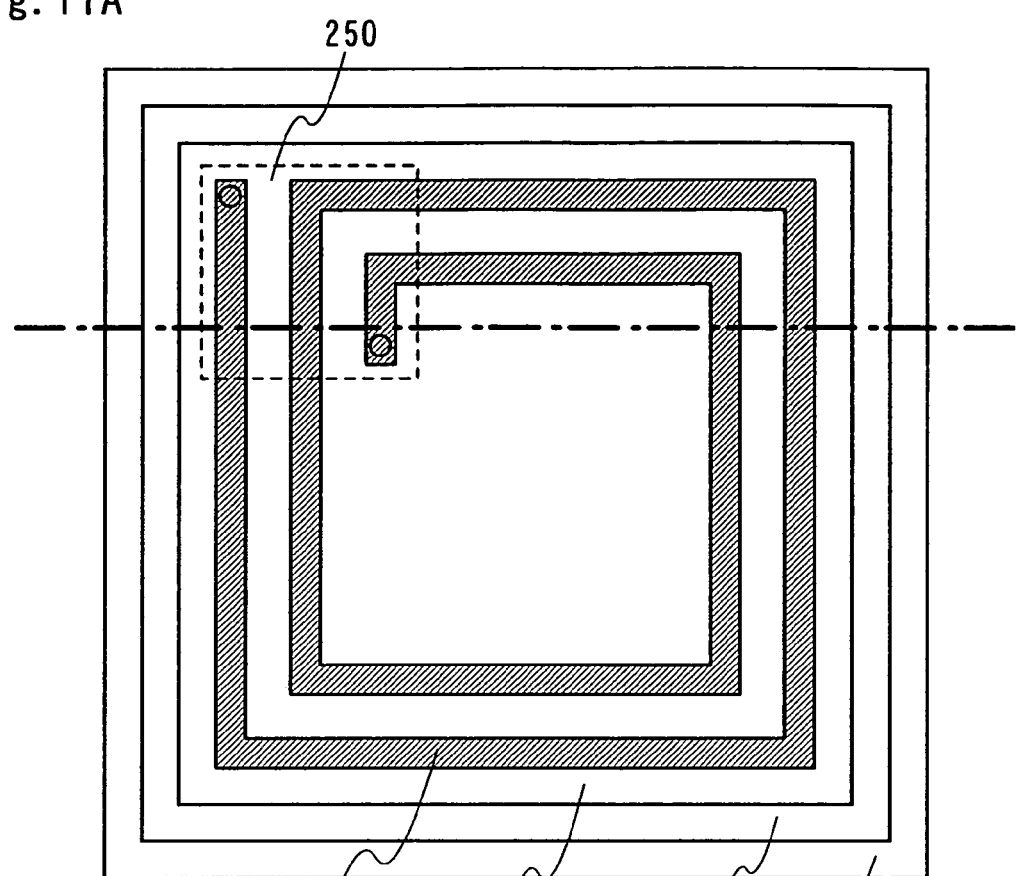
FIGS. 11A and 11B are views each showing a manufacturing method of a semiconductor device according to the present invention (Embodiment 2)
Figure 11B:
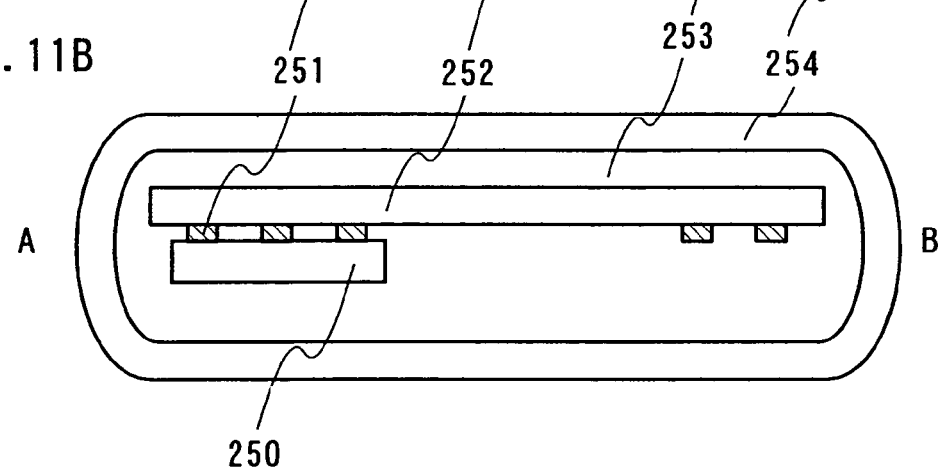

Subsequently, over the peeling layer 12, a layer 13 provided with a plurality of integrated circuits each including an element such as a thin film transistor (hereinafter referred to as an element layer 13) is formed (FIG. 11B). When contamination due to an impurity or the like from the substrate 11 to the element layer 13 is concerned, a base film is preferably provided between the substrate 11 and the element layer 13. For example, when a glass substrate is used as the substrate 11, by providing the base film, alkali metal such as sodium (Na) contained in the glass substrate can be prevented from entering the element layer 13.

The base film may have a single layer structure or a stacked layer structure. In addition, as for a material for the base film, a silicon oxide film (a SiOx film), a silicon nitride film (a SiNx film), a silicon oxide film containing nitrogen (a $SiO_xN_y$ film) (x>y) (x and y are positive numbers), a silicon nitride film containing oxygen (a $SiN_xO_y$ film) (x>y) (x and y are positive numbers), or the like can be formed by a sputtering method, a plasma CVD method, or the like. For example, in a case of employing a two-layer structure for the base film, a silicon nitride film containing oxygen may be used as a first insulating film, and a silicon oxide film containing nitrogen may be used as a second insulating film.

The element layer 13 includes a plurality of integrated circuits, and the plurality of the integrated circuits is individually separated afterwards to become part of a semiconductor device. In other words, the semiconductor device that is formed afterwards includes at least a layer provided with an integrated circuit. The integrated circuit at least includes an element typified by a thin film transistor (TFT) or a resistor. By using the element, various integrated circuits such as a CPU, a memory, and a microprocessor can be formed. Further, the element layer 13 can also have a mode including an antenna in addition to the element such as a thin film transistor. For example, an integrated circuit formed by using a thin film transistor can operate by using alternating voltage generated in an antenna and can perform transmission to a reader/writer by modulating alternating voltage to be applied to the antenna. The antenna may be formed along with the thin film transistor or may be formed independently of the thin film transistor and provided afterwards to be electrically connected to the thin film transistor.

The thin film transistor can be formed by using an amorphous semiconductor or a crystalline semiconductor. In a case of using a thin film transistor having a more excellent characteristic, it is preferable to provide a thin film transistor using a crystalline semiconductor. For example, an amorphous semiconductor film may be formed over the base film by a sputtering method, an LPCVD method, a plasma CVD method, or the like, and thereafter, the amorphous semiconductor film may be crystallized to form a crystalline semiconductor film.

In addition, a structure of a semiconductor film included in the thin film transistor may have any structure. For example, an impurity region (including a source region, a drain region, and an LDD region) may be formed, or a P-channel TFT, an N-channel TFT, or a CMOS circuit may be formed. Further, an insulating film (sidewall) may be formed to be in contact with a side surface of a gate electrode which is provided above or below the semiconductor film. Alternatively, a silicide layer of nickel, molybdenum, cobalt, or the like may be formed in one or both of a source region and a drain region, and a gate electrode.

Figure 1C:
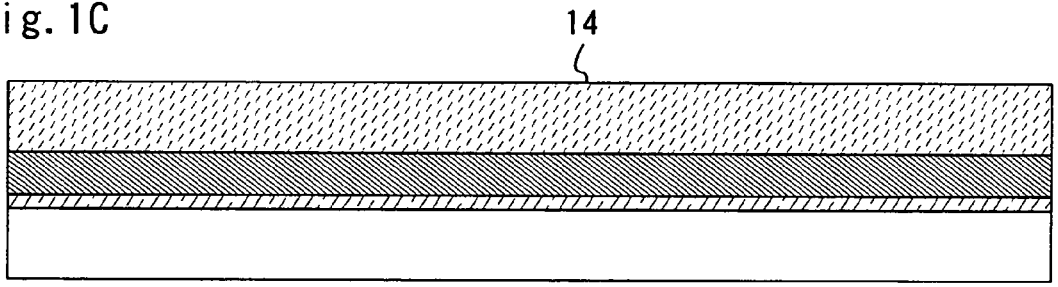

Then, if necessary, an insulating film 14 is formed to cover the element layer 13 (FIG. 1C). The insulating film 14 may function as a protective layer for ensuring the strength of the element layer 13. The insulating film 14 is preferably provided over the entire surface of the element layer 13 so as to cover the element layer 13; however, the insulating film 14 is not always required to be provided over the entire surface and may be selectively provided. As a material for the insulating film 14, a film containing carbon such as DLC (diamond like carbon), a silicon oxide film containing nitrogen, a silicon nitride film containing oxygen, or a film formed of an organic material (for example, a resin material such as epoxy) can be used. As a method for forming the insulating film 14, a sputtering method, various CVD methods such as a plasma CVD method, a spin coating method, a droplet-discharging method, a printing method, or the like can be used. It is to be noted that a structure provided with the insulating film 14 is employed in this embodiment mode; however, the present invention can also be implemented by employing a structure without the insulating film 14.

Figure 1D:
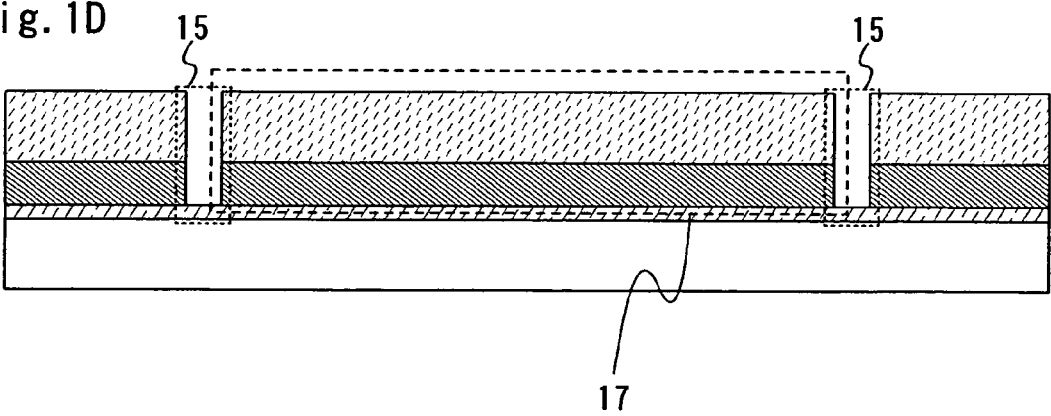

Next, part of the element layer 13 and the insulating film 14 is etched and openings 15 are formed to expose the peeling layer 12 (FIG. 1D). By forming the openings 15, a plurality of layers (each of which is referred to as a stacked body 17 hereinafter) formed using part of the element layer 13 and the insulating film 14 is formed. The element layer 13 that is divided by the openings 15 can be referred to as a layer provided with an integrated circuit.

When the openings 15 are formed, adhesion between the peeling layer 12 and the element layer 13 is selectively (partially) lowered, and the element layer 13 and the insulating film 14 are easily peeled from the substrate 11 afterwards. The openings 15 can be formed by laser light irradiation, a photolithography method, or the like. In addition, the openings 15 are each preferably provided in a region where a thin film transistor or the like is not formed in the element layer 13, or in an end portion of the substrate 11.

A laser includes a laser medium, an excitation source, and a resonator. When lasers are classified in accordance with a medium, there are a gas laser, a liquid laser, and a solid state laser. In the present invention, any of the above lasers can be used. However, it is preferable to use a gas laser or a solid state laser, and it is more preferable to use a solid state laser.

As a gas laser, a helium-neon laser, a carbon dioxide ($CO_2$) laser, an excimer laser, and an argon-ion laser are given. As an excimer laser, a rare gas excimer laser and a rare gas halide excimer laser are given. As for a rare gas excimer laser, there are oscillations by three kinds of excited molecules of argon, krypton, and xenon. As an argon-ion laser, a rare gas ion laser and a metal vapor ion laser are given.

As a liquid laser, an inorganic liquid laser, an organic chelate laser, and a dye laser are given. In an inorganic liquid laser and an organic chelate laser, a rare earth ion such as neodymium used in a solid state laser is utilized as a laser medium.

A laser medium used in a solid state laser is a solid base doped with activated species having laser effect. The solid base is crystal or glass. As the crystal, YAG (yttrium aluminum garnet crystal), YLF, $YVO_4$, $YAlO_3$, sapphire, ruby, or alexandrite can be used. In addition, as the activated species having laser effect, for example, trivalent ions ($Cr^{3+}$, $Nd^{3+}$, $Yb^{3+}$, $Tm^{3+}$, $Ho^{3+}$, $Er^{3+}$, and $Ti^{3+}$) can be used.

As for an oscillation mode of the laser, a continuous wave laser beam or a pulsed laser beam may be used. Irradiation conditions of a laser beam, such as frequency, power density, energy density, and a beam profile are appropriately adjusted in consideration of a characteristic or a thickness of a material used for the element layer 13 or the insulating film 14.

In a step of irradiation of the above laser beam, ablation processing is used. In the ablation processing, a phenomenon is used, in which a molecular bond in a portion irradiated with a laser beam, that is, a portion which has absorbed a laser beam, is cut, photolyzed, vaporized, and evaporated. In other words, in this step, a molecular bond in the element layer 13 or an insulating film included in the insulating film 14 is cut, photolyzed, vaporized, and evaporated by the laser beam irradiation to form the openings 15.

Further, as a laser, a solid state laser with a wavelength of 1 to 380 nm (more preferably, 15 to 20 nm) that is an ultraviolet region may be used. Preferably, an Nd:$YVO_4$ laser with a wavelength of 1 to 380 nm is used. This is because, as for the Nd: $YVO_4$ laser with a wavelength of 1 to 380 nm, light is easily absorbed in the substrate compared with other laser on longer wavelength side, and ablation processing is possible. In addition, the periphery of a processed portion is not affected and processability is favorable.

Figure 2A:
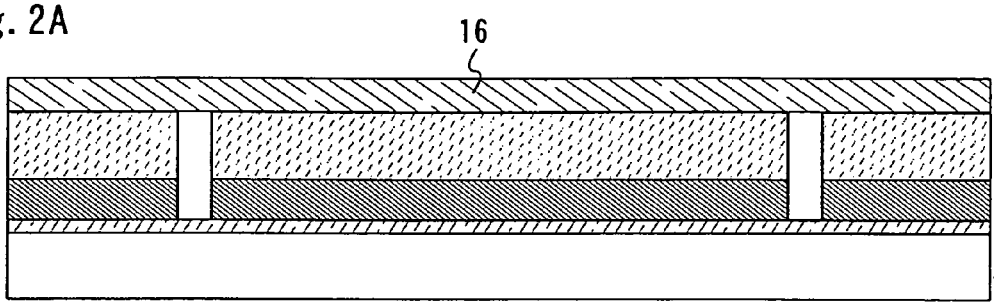
FIGS. 2A to 2D are views each showing a manufacturing method of a semiconductor device according to the present invention (Embodiment Mode 1)

Subsequently, a film 16 is attached to the insulating film 14 (FIG. 2A). The film 16 has a function of ensuring a space between the integrated circuit when the integrated circuits are separated from the film 16 afterwards. As the film having such a function, an expand film may be used. Further, a film protecting the element layer 13 and the expand film may be stacked. In addition, the film 16 preferably has a characteristic that adhesion thereof is high in a normal state and the adhesion becomes low by light irradiation. For example, a UV tape in which the adhesion becomes low by irradiation of ultraviolet ray may be used.

Figure 2B:
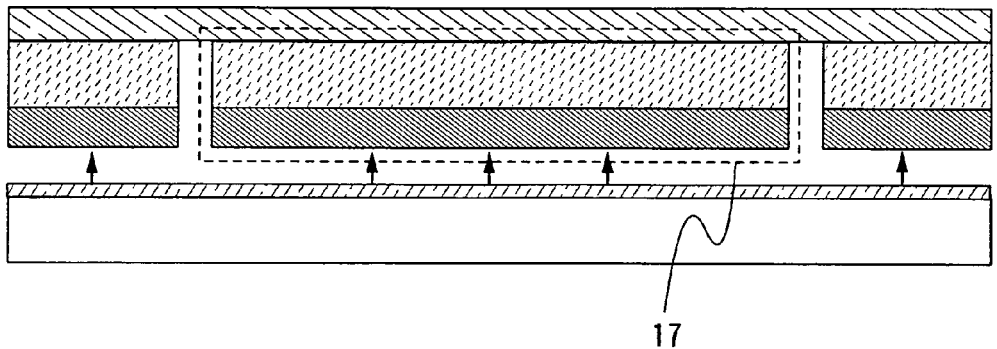

Then, the element layer 13 and the insulating film 14 are peeled from the substrate 11 by using a physical means (FIG. 2B). Since adhesion between the peeling layer 12 and the element layer 13 is selectively (partially) lowered by forming the openings 15 before the peeling, the element layer 13 and the insulating film 14 can be easily peeled from the substrate 11 by a physical means. As an example of the physical means, there is a method in which impact (stress) is applied from the outside by using pressure of a gas blown from a nozzle, an ultrasonic wave, load using a wedge-shaped member, or the like. It is to be noted that the stacked body 17 including part of the element layer 13 and the insulating film 14, which is peeled in this step, is part of the semiconductor device that is formed afterwards.

It is to be noted that the peeled substrate 11 can be reused after removing the peeling layer 12; therefore, the semiconductor device can be manufactured at lower cost. For example, even in a case of using a quartz substrate which is high in cost, a semiconductor device can be manufactured at low cost by using a quartz substrate repeatedly.

In addition, not only a peeling method using a physical means after forming the openings 15 as described above, but also a peeling method using a physical means after forming the openings 15 and removing the peeling layer 12 by introducing an etching agent into the openings 15 can be used. In this case, the entire peeling layer 12 may be removed or the peeling layer 12 may be selectively removed to leave part thereof. By leaving part of the peeling layer 12, the stacked body 17 can be retained over the substrate 11 also after removing the peeling layer 12. In addition, since the peeling layer 12 is not entirely removed, the consumption amount of an etching agent can be reduced and treatment time can be shortened; therefore, low cost and high efficiency can be realized. As the etching agent, a gas or liquid containing halogen fluoride or halogen, such as a chlorine trifluoride gas, can be used. In addition, $CF_4$, $SF_6$, $NF_3$, $F_2$, or the like can also be used.

Next, a first stacked film (also referred to as a laminate film) is provided over one surface of the stacked body 17 which is peeled from the substrate 11. The first stacked film is provided by performing one or both of heat treatment and pressure treatment after being adhered to a surface of the stacked body 17, over which the element layer 13 is provided.

Subsequently, a second stacked film is provided over the other surface of the stacked body 17 (the opposite surface of the surface provided with the first stacked film, that is, a surface of the stacked body 17, over which the insulating film 14 is provided). In this case, in order to further thin the semiconductor device, the second stacked film is preferably provided after removing the film 16. In addition, as the second stacked film, the same structure as that of the first stacked film is preferably employed.

Figure 2C:
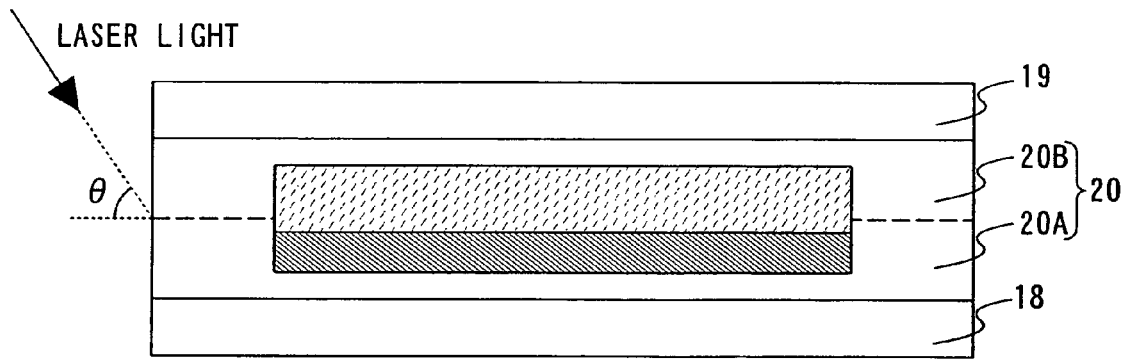

The first stacked film and the second stacked film each include an adhesive layer at least on one surface thereof and may be attached so that the adhesive layers and the stacked body 17 are in contact. In addition, the first stacked film and the second stacked film are each formed of a film in which a base material (base film) and an adhesive layer are stacked. In this embodiment mode, the first stacked film includes a first base material 18 and a first adhesive layer 20A, and the second stacked film includes a second base material 19 and a second adhesive layer 20B. In the vicinity of the side surface of the stacked body 17, the first adhesive layer 20A of the first stacked film and the second adhesive layer 20B of the second stacked film are attached to each other to be an adhesive layer 20 (FIG. 2C).

As the base material (base film), a material having a melting point that is at least higher than that of a material used as adhesive may be used, and a material may be selected to be suitable for the purpose. In other words, not only a single layer film but also a film in which films having different characteristics are appropriately stacked may be used. Specifically, as a film that can be used as the base material, a material such as polyethylene, polyethylene terephthalate (PET), polyethylene naphthalate (PEN), nylon, an ethylene vinyl alcohol copolymer (EVOH) film, polypropylene, polystyrene, an AS resin, an ABS resin (a resin obtained by polymerization of acrylonitrile, butadiene and styrene), a methacrylic resin (also referred to as acrylic), polyvinyl chloride, polyacetal, polyamide, polycarbonate, denatured polyphenylene ether, polybutylene terephthalate (PBT), polysulfone, polyethersulfone (PES), polyphenylene sulfide, polyamide-imide, polymethylpentene, a phenol resin, a urea resin, a melamine resin, an epoxy resin, a diallyl phthalate resin, an unsaturated polyester resin, polyimide, or polyurethane, a fibrous material (for example, paper), a film to which antistatic treatment is performed (an antistatic film), or the like can be given.

As the film to which antistatic treatment is performed, a film obtained by dispersing an antistatic material into a resin, a film to which an antistatic material is attached, or the like can be given. As for the film to which an antistatic material is attached, an antistatic material may be attached to one side of a film that is a base material, or an antistatic material may be attached to both sides thereof. In addition, as for the film in which an antistatic material is attached to one side, an antistatic material may be attached to an outer side of the film but is preferably attached to an inner side of the film. Further, an antistatic material may be attached to the entire surface or part of the surface of the film. As the antistatic material, metal such as aluminum, oxide containing indium and tin (ITO), amphoteric surfactant metal salt, imidazoline type amphoteric surfactant, a resin material containing a cross-linked copolymer high molecule having a carboxyl group and a quaternary ammonium base in a side chain, or the like can be given. By using the antistatic film as the first base material 18 and the second base material 19, the integrated circuit can be prevented from being affected due to static electricity from the outside.

As the adhesive, a material having a melting point that is at least lower than that of a material used as the base material may be used. For example, a polyethylene based resin, a polyester based resin, a thermal flexible resin such as ethylene vinyl acetate (EVA), or a material containing a thermosetting resin or an ultraviolet ray curable resin as its main component can be used. In addition, when the film is adhered to the element layer by performing heat treatment and pressure treatment, an adhesive layer provided on the uppermost surface of the stacked film or a layer (not an adhesive layer) provided in the outermost layer is melted by heat treatment and adhered by pressure treatment.

In addition, in order to further prevent moisture from entering inside the semiconductor device (the stacked body 17) that is finally formed, it is preferable to coat a portion between the base material and the adhesive layer with powder of silicon dioxide (silica). By this coating, a moisture proof property can be further enhanced even under a circumstance of a high temperature and high humidity. In addition, for the similar purpose, a stacked film may be used, in which a film containing silicon oxide, silicon nitride, silicon nitride containing oxygen, silicon oxide containing nitrogen, or ceramics (for example, aluminum oxide) as its main component is formed in a portion between the base material and the adhesive layer by a CVD method, a sputtering method, an evaporation method, or the like. Accordingly, moisture or the like may be further prevented from entering inside the semiconductor device (the stacked body 17) that is finally formed. In addition, in order to enhance physical strength of the semiconductor device that is finally formed, the opposite surface of the base material surface provided with the adhesive layer (the side exposed to the outside) may be coated with a material containing carbon as its main component (for example, diamond like carbon) by a CVD method, a sputtering method, an evaporation method, or the like. Further, coating of a mixture of silicon dioxide (silica) powder, silicon nitride containing oxygen, or silicon oxide containing nitrogen and a material containing carbon as its main component may also be performed. It is to be noted that such treatment may be performed to one or both of the first stacked film and the second stacked film.

Then, the first stacked film and the second stacked film are cut by a cutting means. The cutting means corresponds to a dicer, a laser, a wire saw, or the like. Through this cutting step, as shown in FIG. 2C, a structure, in which the stacked body 17 is surrounded by the adhesive layer 20 and both surfaces of the adhesive layer 20 are sealed with the first base material 18 and the second base material 19, is obtained. At this time, the side surfaces of the adhesive layer 20 are exposed to the outside.

Figure 2D:
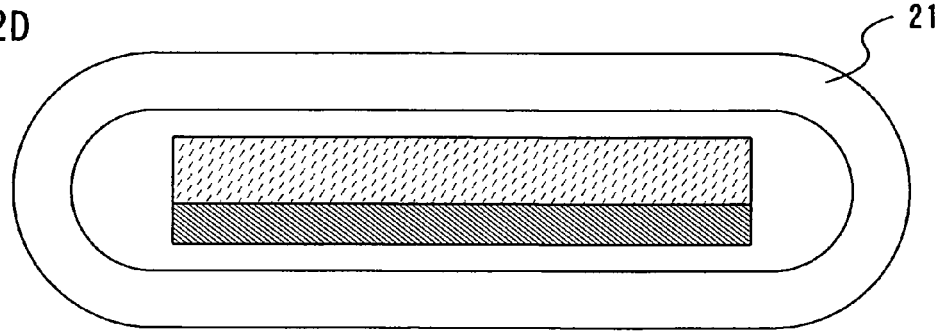

Next, a cross-section (side surface) of the first stacked film and the second stacked film is irradiated with laser light (FIG. 2C). By laser light irradiation, the first base material 18 and the second base material 19 are adhered to each other to be a third base material 21, and a structure in which a cross-section (side surface) of the adhesive layer 20 is sealed with the third base material 21 is obtained. At this time, at least one of the first base material 18 and the second base material 19 may be melted to be adhered by laser light irradiation; however, both of the first base material 18 and the second base material 19 are preferably melted to be adhered to each other. A semiconductor device in which the cross-section (side surface) of the adhesive layer 20 is covered with the third base material 21 is formed (FIG. 2D). It is to be noted that FIG. 2D schematically shows a shape of the third base material 21, but the third base material 21 is not limited to this shape.

Conditions of laser light used in the above step are not particularly limited as far as the first base material 18 and the second base material 19 are adhered to each other. For example, a $CO_2$ laser can be used. In addition, a laser with a wavelength of 100 to 380 nm (UV) (for example, a solid state laser such as a third harmonic of an Nd:$YVO_4$ laser) can also be used. When an ultraviolet laser is used, power density may be set to be 2 W/cm$^2$ or more and 3 W/cm$^2$ or less. In addition, a scanning rate of laser light may be set to be 0.5 mm/sec. or more and 1.5 mm/sec. or less. It is to be noted that a scanning rate of laser light is a rate of relative movement of laser light with respect to the cross-section (side surface) of the first stacked film and the second stacked film. Further, a beam spot shape of laser light is not particularly limited, and a circular shape, an elliptical shape, a rectangular shape, or the like may be employed.

Then, an irradiation angle of laser light is explained. As for an angle achieved by a direction of laser light irradiation to the cross-section (side surface) of the first stacked film and the second stacked film and a perpendicular line to the cross-section (side surface) of the first stacked film and the second stacked film (or a parallel surface to one surface of the stacked body 17), in other words, an incident angle of laser light to the cross-section (side surface) of the first stacked film and the second stacked film ($\theta$; $0° \leq \theta \leq 90°$), it is preferable to obliquely irradiate the cross-section (side surface) of the first stacked film and the second stacked film as shown in FIG. 2C. When the first stacked film and the second stacked film cannot sufficiently absorb laser light in a case where $\theta$ is less than 30°, there is a concern that the element provided inside the stacked body 17 is broken. Therefore, $\theta$ is preferably 30° or more. In addition, in a case where $\theta$ is more than 80°, sealing of the cross-section of the adhesive layer 20 becomes difficult. Therefore, $\theta$ is preferably 80° or less. For the above reasons, $\theta$ is preferably 30° or more and 80° or less (more preferably, $\theta$ is 45° or more and 65° or less); however, parallel irradiation to the cross-section (side surface) of the first stacked film and the second stacked film (that is, $\theta$ is 90°) may also be employed. It is to be noted that a method of laser light irradiation is used in this embodiment mode; however, other method may also be used as far as the adhesive layer 20 can be sealed with the first base material 18 and the second base material 19.

As described above, after sealing the stacked body 17 with the first and the second stacked films each including the adhesive layer, laser light irradiation is performed to the exposed cross-section (side surface) of the first stacked film and the second stacked film, and thus, the first base material 18 and the second base material 19 are adhered to each other. By employing a structure in which a cross-section (side surface) of an adhesive layer is not exposed to the outside, moisture or a substance causing contamination can be prevented from entering inside a semiconductor device, and thus, a semiconductor device which is excellent in chemical and physical strength and circumstance resistance can be obtained. As a result, the yield of a semiconductor device can be improved and the semiconductor device can be manufactured at lower cost. Further, the semiconductor device manufactured in this embodiment mode is usually formed by being peeled from the substrate without flexibility because of its thickness. Therefore, a semiconductor device having flexibility can be obtained, and the semiconductor device can be provided in various places such as a curved portion of an object.

Embodiment Mode 2

In this embodiment mode, a method for manufacturing a semiconductor device, which is different from the method explained in Embodiment Mode 1, will be explained.

Figure 3A:
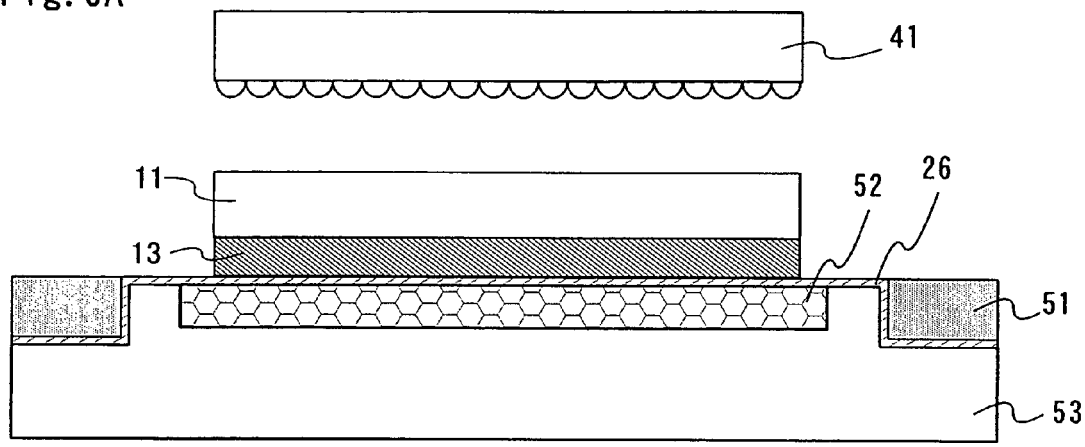
FIGS. 3A to 3C are views each showing a manufacturing method of a semiconductor device according to the present invention (Embodiment Mode 2)

First, over one surface of a substrate 11, a layer 13 provided with a plurality of integrated circuits each including an element such as a thin film transistor (hereinafter referred to as an element layer 13) is formed (FIG. 3A). In this specification, "one surface of the substrate 11" refers to a surface provided with the element layer 13. Materials and formation methods for the substrate 11 and the element layer 13 have been explained in Embodiment Mode 1; therefore, subsequent steps are explained in detail.

When contamination due to an impurity or the like from the substrate 11 to the element layer 13 is concerned, a base film is preferably formed between the substrate 11 and the element layer 13. The base film can be appropriately formed of the material shown in Embodiment Mode 1.

In addition, as a protective layer for ensuring the strength of the element layer 13, an insulating film may be formed to cover the element layer 13. The insulating film is preferably provided over the entire surface of the element layer 13 so as to cover the element layer 13; however, the insulating film is not always required to be provided over the entire surface and may be selectively provided. As a material for the insulating film, a film containing carbon such as DLC (diamond like carbon), a silicon oxide film containing nitrogen, a silicon nitride film containing oxygen, or a film formed of an organic material (for example, a resin material such as epoxy) can be used. As a method for forming the insulating film, a sputtering method, various CVD methods such as a plasma CVD method, a spin coating method, a droplet-discharging method, a printing method, or the like can be used.

Subsequently, a film 26 is attached to the element layer 13. Then, the film 26 is set on an adsorption jig by using a substrate fixing jig (frame) 51 (FIG. 3A). The adsorption jig is formed by using, for example, a porous chuck 52 and a stage 53. The porous chuck 52 is formed of a porous substance and has a vacuum chuck mechanism. Further, the film 26 is set so that one surface (a surface provided with the film 26) of the substrate 11 is higher than one surface of the substrate fixing jig 51. Therefore, the substrate fixing jig 51 itself is not ground or polished.

The film 26 has a function of fixing the substrate when the substrate is ground or polished afterwards, a function of protecting the element layer 13, or a function of ensuring a space between the semiconductor devices when the semiconductor devices are separated from the film 26. As the film having such functions, an expand film may be used. In addition, a film protecting the element layer 13 and the expand film may be stacked. Further, the film 26 preferably has a characteristic that adhesion thereof is high in a normal state and the adhesion becomes low by light irradiation. For example, a UV tape in which the adhesion becomes low by irradiation of ultraviolet ray may be used.

Then, by a grinding means 41, the other surface of the substrate 11 is ground. At this time, the substrate 11 is ground so as to have a thickness of 100 μm or less. Generally, in this grinding step, one or both of the stage 53 on which the substrate 11 is fixed and the grinding means 41 are rotated to grind the other surface of the substrate 11. The grinding means 41 corresponds to, for example, a grinding stone. In this specification, "the other surface of the substrate 11" refers to the opposite surface of the surface provided with the element layer 13, and the surface which is ground by the grinding means 41. It is to be noted that cleaning may be performed if necessary in order to remove a dust generated in the grinding step. In this case, a water droplet generated by cleaning is naturally dried or dried by using a drying means. As the drying means, specifically, a method of rotating the substrate 11, a method of spraying air (atmosphere) or a gas such as a rare gas to the substrate 11 by using a blower, or the like can be given.

Figure 3B:
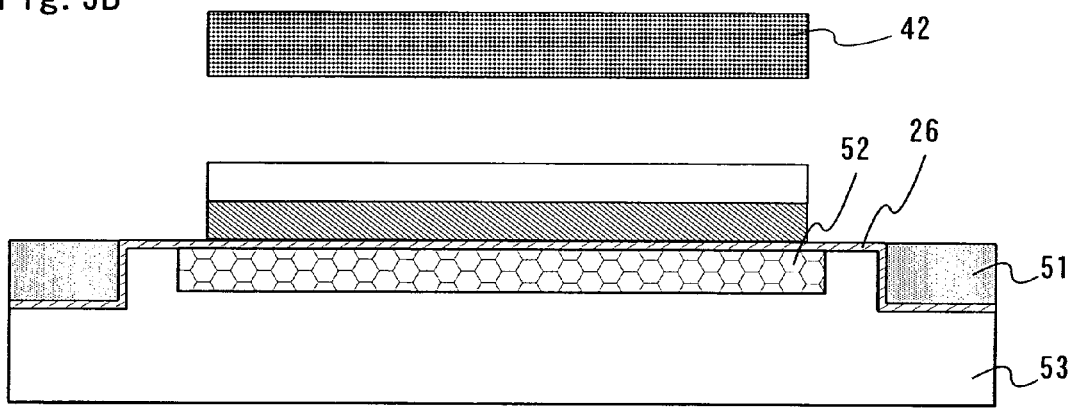

Next, by a polishing means 42, the other surface of the substrate 11, which is ground, is polished (FIG. 3B). The substrate 11 may be polished so as to have a thickness that is thinner than 100 μm, and is preferably polished so as to have a thickness of 2 μm or more and 50 μm or less (more preferably, 4 μm or more and 30 μm or less). By grinding and polishing the substrate 11 as described above, the substrate 11 has flexibility and a semiconductor device having flexibility can be manufactured without using a method for peeling the element layer from the substrate 11. Also in this polishing step, similarly to the above grinding step, one or both of the stage 53 on which the substrate 11 is fixed and the polishing means 42 are rotated to polish the other surface of the substrate 11. The polishing means 42 corresponds to, for example, a polishing pad coated with polishing abrasive particles (such as cerium oxide). It is to be noted that cleaning may be performed if necessary in order to remove a dust generated in the polishing step. In this case, a water droplet generated by cleaning is naturally dried or dried by using a drying means. As the drying means, specifically, a method of rotating the substrate 11, a method of spraying air (atmosphere) or a gas such as a rare gas to the substrate 11 by using a blower, or the like can be given.

Figure 3C:
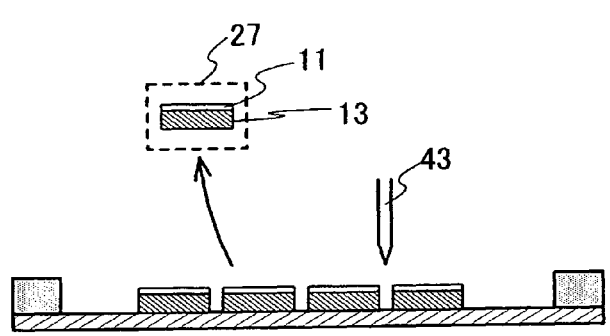

Subsequently, the film 26 is removed from the adsorption jig. Then, by a cutting means 43, the substrate 11 and the element layer 13 are cut so as not to cut the film 26 (FIG. 3C). At this time, boundaries of the plurality of the integrated circuits (between the integrated circuits) are cut so that the plurality of the integrated circuits included in the element layer 13 is individually separated. In addition, cutting is performed so that the element provided in the element layer 13 is not cut, and the insulating film provided in the element layer 13 is cut. Through this cutting step, a plurality of stacked bodies 27 each including the thinned substrate 11 and a layer 13 provided with the integrated circuit is formed. The cutting means corresponds to, for example, a dicer, a laser, or a wire saw.

Figure 4A:
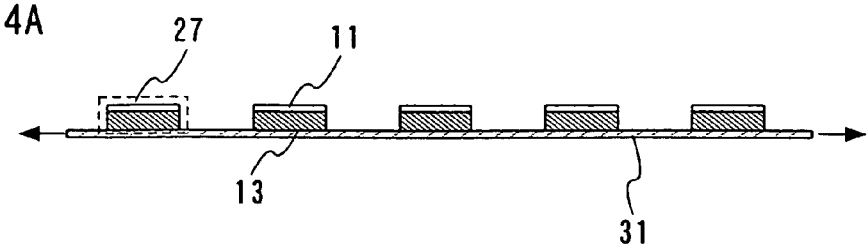
FIGS. 4A to 4D are views each showing a manufacturing method of a semiconductor device according to the present invention (Embodiment Mode 2)

Then, the film 26 is drawn so that spaces are formed between the stacked bodies 27 (FIG. 4A). Herein, it is preferable to draw the film 26 uniformly in the surface direction (to draw equally in the surface direction) so as to make the spaces between the stacked bodies 27 equal. Then, the film 26 is irradiated with light. In a case where the film 26 is a UV tape, the film 26 is irradiated with ultraviolet ray. By light irradiation, adhesion of the film 26 is lowered, and thus, adhesion between the film 26 and the stacked bodies 27 is lowered, leading to a state where the stacked bodies 27 can be separated from the film 26 by a physical means.

It is to be noted that, in the above steps, the step of irradiating the film 26 with light is carried out after the step of drawing the film 26; however, the present invention is not limited to this order. The step of drawing the film 26 may be carried out also after the step of irradiating the film 26 with light.

Next, sealing treatment is performed to the stacked body 27. As the sealing treatment, there are two types of methods. First, a first method is explained.

Figure 4B:
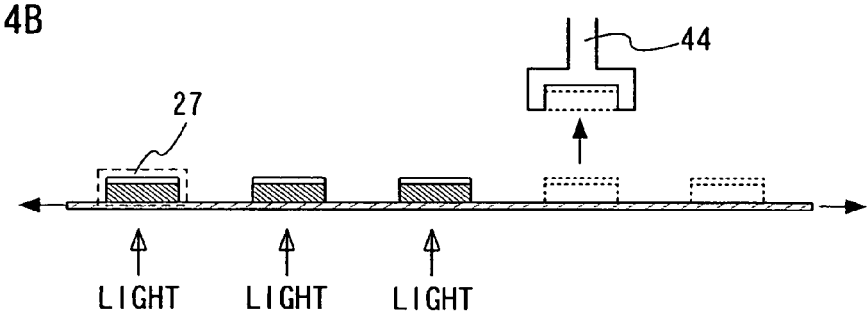

In the first method, by a transfer means 44, the stacked body 27 is separated from the film 26 (FIG. 4B). Then, the stacked body 27 is set over a first stacked film 61 by the transfer means 44 so that one surface of the stacked body 27 is adhered to the first stacked film 61. It is to be noted that the transfer means 44 is specifically a lift up using a pin, a pick up using an arm, a contact transfer means such as vacuum adsorption using a vacuum mechanism, a non-contact transfer means using a magnetic force, air pressure, or an electrostatic force as adsorption power or buoyancy, or the like.

Figure 4C:
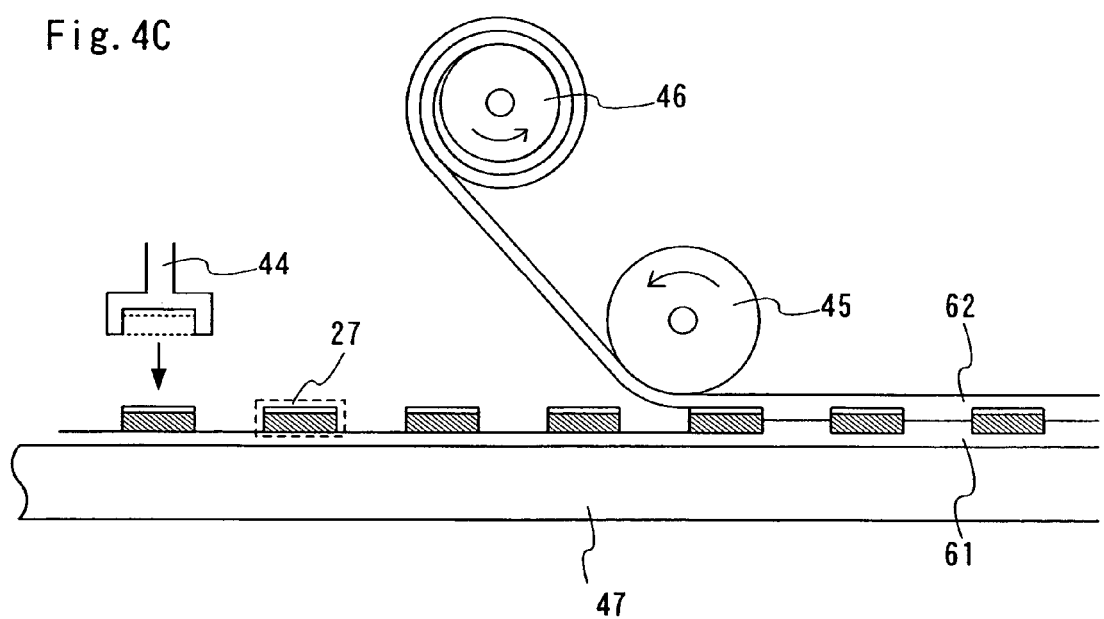

Subsequently, the other surface of the stacked body 27 is adhered to a second stacked film 62 (FIG. 4C). This step is carried out by using an adhesion apparatus (hereinafter referred to as a laminate apparatus). The laminate apparatus includes a first roll 45 having one or both of a heating means and a pressure means, and a second roll 46, around which the second stacked film 62 is wound, supplying the second stacked film 62 to the first roll 45.

The first stacked film 61 over which the plurality of stacked bodies 27 is set is sequentially conveyed by a conveying means 47. In addition, the first roll 45 and the second roll 46 are each sequentially rotated to continuously perform sealing treatment of the stacked bodies 27. In the sealing treatment described here, when the first stacked film 61 to which the stacked bodies 27 are adhered passes between the first roll 45 and the conveying means 47, one or both of pressure treatment and heat treatment are performed; therefore, the first stacked film 61 and the second stacked film 62 are adhered to the stacked bodies 27. In a case where heat treatment is performed by the first roll 45 and the conveying means 47, the first roll 45 has a heating means corresponding to a heater of a heating wire, oil, or the like. In addition, when both of heat treatment and pressure treatment are performed, an adhesive layer provided over the uppermost surface of the stacked film is melted by heat treatment and adhered by pressure treatment. The conveying means 47 corresponds to a belt conveyer, or a plurality of rollers or robot arms.

The first stacked film 61 used for sealing includes a first base material and a first adhesive layer, and the second stacked film 62 includes a second base material and a second adhesive layer. As the base material and, the adhesive layer, the materials explained in Embodiment Mode 1 can be appropriately employed. In addition, the first stacked film 61 and the second stacked film 62 are adhered to the stacked body 27 by thermocompression bonding (heat treatment and pressure treatment).

Figure 4D:
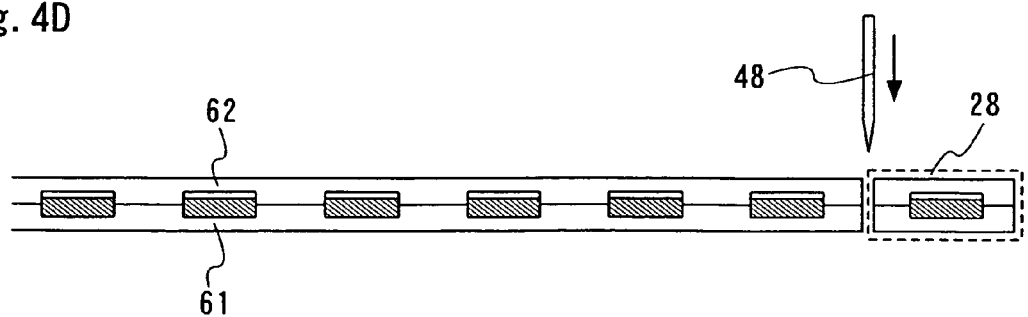

Then, by a cutting means 48, the first stacked film 61 and the second stacked film 62 are cut (FIG. 4D). The cutting means 48 corresponds to a dicer, a laser, a wire saw, or the like. Through this cutting step, a structure, in which the stacked body 27 is surrounded by the adhesive layer and both surfaces of the adhesive layer are sealed with the first base material and the second base material, is obtained. At this time, the side surface of the adhesive layer is exposed to the outside.

Next, the surface where the adhesive layer is exposed (the side surface of the adhesive layer) is irradiated with laser light. By laser light irradiation, the first base material and the second base material are adhered to each other, and a third base material is formed. Then, a semiconductor device in which also the side surface of the adhesive layer is covered with the third base material is formed.

Conditions of laser light used in the above step are not particularly limited as far as the first base material and the second base material can be adhered to each other. For example, a $CO_2$ laser can be used. In addition, a solid state laser with a wavelength of 100 to 380 nm (UV) (for example, an Nd: $YVO_4$ laser) can also be used. As for an irradiation angle ($\theta$) of laser light with respect to the side surface of the adhesive layer, the side surface of the adhesive layer may be obliquely irradiated (preferably, $\theta=100$ or more and 60° or less, more preferably, $0=25°$ or more and 45° or less), or the side surface of the adhesive layer may be irradiated in parallel (that is, $\theta=90°$). In particular, when a laser is used for cutting the first stacked film 61 and the second stacked film 62, a structure, in which the adhesive layer is sealed with the first base material and the second base material at the same time as cutting, can be obtained by appropriately setting the conditions of the laser.

Subsequently, a second method is explained.

Figure 5A:
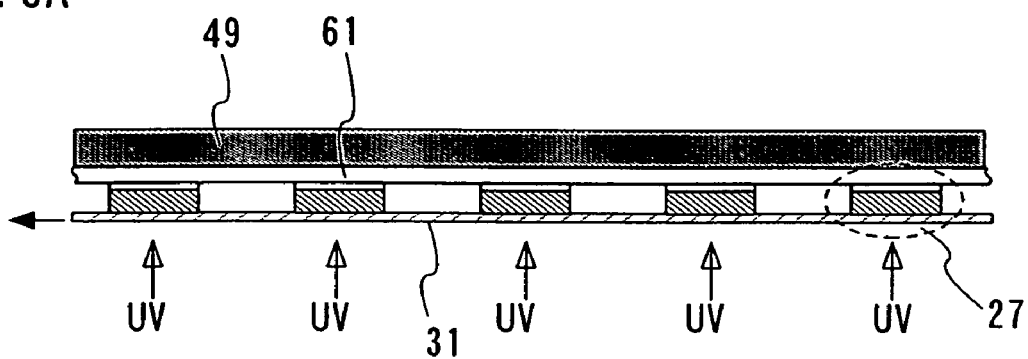
FIGS. 5A and 5B are views each showing a manufacturing method of a semiconductor device according to the present invention (Embodiment Mode 2)
Figure 5B:
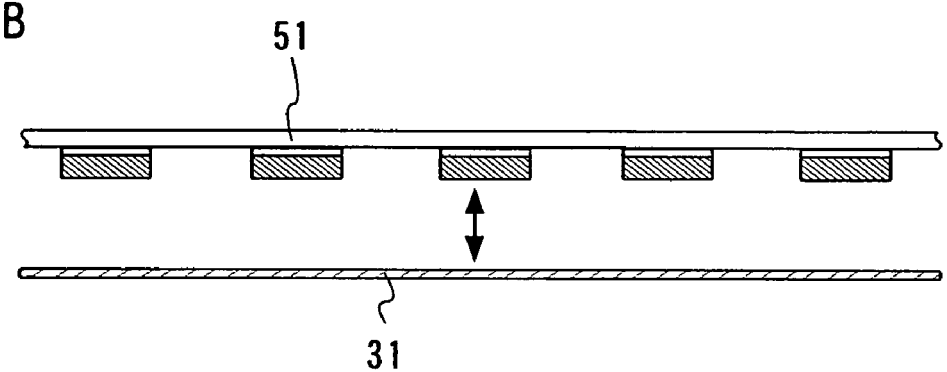

First, the film 26 is irradiated with light in order to lower adhesion between the film 26 and the stacked body 27. Then, a first stacked film 61 is provided so as to cover one surface of the stacked body 27 (FIG. 5A). Then, the first stacked film 61 is heated by a heating means 49, and one surface of the stacked body 27 is adhered to the first stacked film 61. Subsequently, the stacked body 27 is separated from the film 26 (FIG. 5B).

It is to be noted that, in the second method, the first stacked film 61 is provided so as to cover one surface of the stacked body 27 after irradiating the film 26 with light. However, the present invention is not limited to this order. For example, the first stacked film 61 may be provided so as to cover one surface of the stacked body 27, and the film 26 may be irradiated with light after heating the first stacked film 61.

Then, the other surface of the stacked body 27 is adhered to a second stacked film 62. Subsequently, the first stacked film 61 and the second stacked film 62 are cut. A cutting means corresponds to a dicer, a laser, a wire saw, or the like. Through this cutting step, a structure, in which the stacked body 27 is surrounded by an adhesive layer and both surfaces of the adhesive layer are sealed with a first base material and a second base material, is obtained. At this time, the side surface of the adhesive layer is exposed to the outside.

Next, the surface where the adhesive layer is exposed (the side surface of the adhesive layer) is irradiated with laser light. By laser light irradiation, the first base material and the second base material are adhered to each other, and a third base material is formed. Then, a semiconductor device in which also the side surface of the adhesive layer is covered with the third base material is formed.

Conditions of laser light used in the above step are not particularly limited as far as the first base material and the second base material can be adhered to each other. For example, a $CO_2$ laser can be used. In addition, a solid state laser with a wavelength of 100 to 380 nm (UV) (for example, an Nd: YVO4 laser) can also be used. As for an irradiation angle ($\theta$) of laser light with respect to the side surface of the adhesive layer, the side surface of the adhesive layer may be obliquely irradiated (preferably, $\theta=10°$ or more and 60° or less, more preferably, $\theta=250$ or more and 45° or less), or the side surface of the adhesive layer may be irradiated in parallel (that is, θ=90°). In particular, when a laser is used for cutting the first stacked film 61 and the second stacked film 62, a structure, in which the adhesive layer is sealed with the first base material and the second base material at the same time as cutting, can be obtained by appropriately setting the conditions of the laser.

In a semiconductor device that is completed through the above steps, moisture or a substance causing contamination can be prevented from entering. Therefore, a semiconductor device which is excellent in chemical and physical strength and circumstance resistance can be obtained. Consequently, the yield of a semiconductor device is improved, and a semiconductor device can be manufactured at lower cost. Further, since a substrate is thin, the semiconductor device can be provided in various places such as a curved portion of an object. In addition, since a substrate is thin, a thickness of the entire semiconductor device is thinner, and attractive design of an object is not damaged when the semiconductor device is mounted on the object.

This embodiment mode can be implemented by freely combining with the above embodiment mode. In other words, materials or formation methods described in the above embodiment mode can be used in this embodiment mode, and materials or formation methods described in this embodiment mode can be used in the above embodiment mode.

Embodiment 1

In this embodiment, a method for manufacturing a semiconductor device including a thin film transistor and an antenna will be explained with reference to the drawings. In particular, a structure of an element layer will be explained in detail.

Figure 6A:
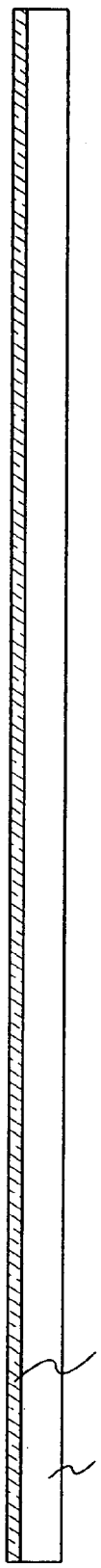
FIGS. 6A to 6C are views each showing a manufacturing method of a semiconductor device according to the present invention (Embodiment 1)
Figure 6B:
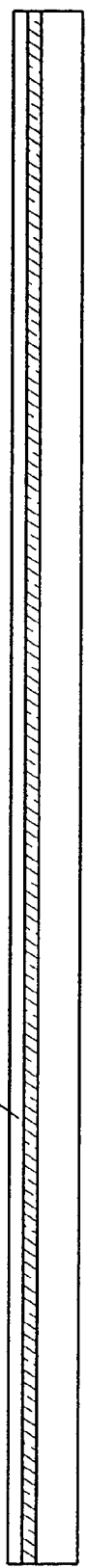

First, a peeling layer 702 is formed over a substrate 701 (FIG. 6A). Then, a base film 703 is formed over the peeling layer 702 (FIG. 6B). The explanation about a material and a formation method of the substrate 701, the peeling layer 702, and the base film 703 is herein omitted because the material and the formation method described in Embodiment Mode 1 can be used. Steps of forming an element layer over the base film 703 are hereinafter explained. It is to be noted that the present invention can also be implemented with a structure in which the base film 703 is not provided.

Figure 6C:
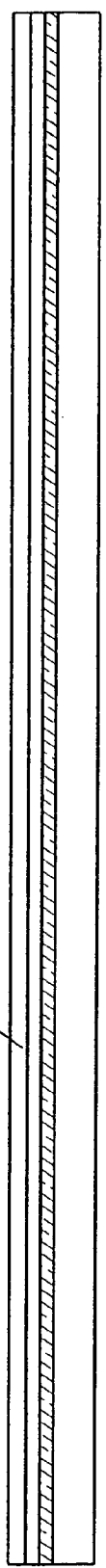
Figure 7A:
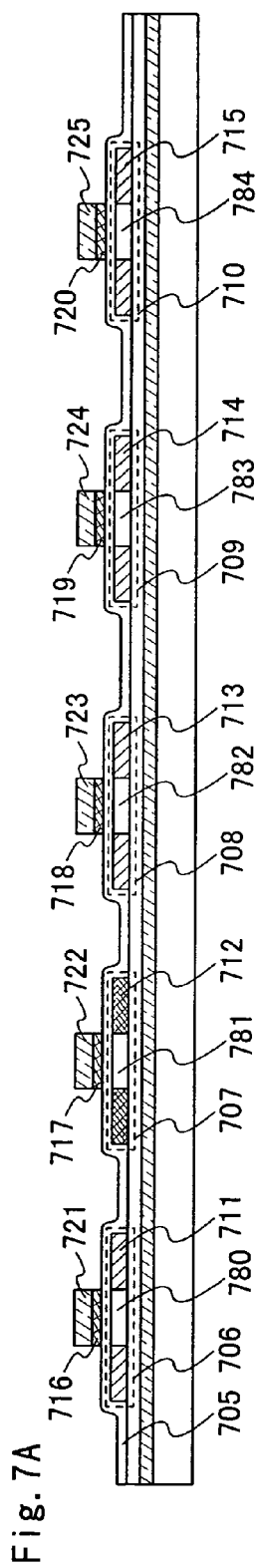
FIGS. 7A to 7C are views each showing a manufacturing method of a semiconductor device according to the present invention (Embodiment 1)

First, an amorphous semiconductor film 704 (for example, a film containing amorphous silicon as its main component) is formed over the base film 703 (FIG. 6C). The amorphous semiconductor film 704 is formed to have a thickness of 25 to 200 nm (preferably, 30 to 150 nm) by a sputtering method or various CVD methods such as a plasma CVD method. Subsequently, the amorphous semiconductor film 704 is crystallized to form a crystalline semiconductor film. As a crystallization method, a laser crystallization method, a thermal crystallization method using RTA or an annealing furnace, a thermal crystallization method using a metal element for promoting crystallization, a method in which a thermal crystallization method using a metal element for promoting crystallization and a laser crystallization method are combined, or the like can be used. Thereafter, an obtained crystalline semiconductor film is processed into a desired shape to form crystalline semiconductor films 706 to 710 (FIG. 7A). It is to be noted that the base film 703 and the amorphous semiconductor film 704 can be continuously formed without being exposed to atmosphere.

An example of manufacturing steps of the crystalline semiconductor films 706 to 710 is briefly explained below. As a method for crystallizing the amorphous semiconductor film, a laser crystallization method, a thermal crystallization method using RTA or an annealing furnace, a thermal crystallization method using a metal element for promoting crystallization, a method in which a thermal crystallization method using a metal element for promoting crystallization and a laser crystallization method are combined, or the like can be given. Further, as another crystallization method, crystallization may be performed by generating thermal plasma by applying DC bias and making the thermal plasma influence the semiconductor film.

In this embodiment, an amorphous semiconductor film having a thickness of 25 to 200 nm is formed by a plasma CVD method, and then, the amorphous semiconductor film is crystallized by heat treatment to form the crystalline semiconductor films 706 to 710. As the heat treatment, a laser heating furnace, laser irradiation, irradiation of light emitted from a lamp instead of laser light (hereinafter, referred to as lamp annealing), or a combination thereof can be used.

In a case of laser irradiation, a continuous wave oscillation laser beam (a CW laser beam) or a pulsed oscillation laser beam (a pulsed laser beam) can be used. As a laser beam that can be used here, a laser beam emitted from one or more kinds of a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or more kinds of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be given. By irradiation of the fundamental waves of such a laser beam or the second harmonic to fourth harmonic laser beam of these fundamental waves, large grain crystal can be obtained. For example, the second harmonic (532 nm) or the third harmonic (355 nm) of an Nd:YVO$_4$ laser (fundamental wave: 1064 nm) can be used. As for an Nd:YVO$_4$ laser, either pulsed oscillation or continuous wave oscillation can be performed. In a case of continuous wave oscillation, the power density of the laser needs to be approximately 0.01 to 100 MW/cm$^2$ (preferably 0.1 to 10 MW/cm$^2$). Then, irradiation is carried out at a scanning rate of approximately 10 to 2000 cm/sec.

Further, a laser using, as a medium, single crystal YAG, YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or more kinds of Nd, Yb, Cr, Ti, Ho, Er, Tm and Ta as a dopant; an Ar ion laser; or a Ti:sapphire laser can perform continuous wave oscillation. In addition, pulsed oscillation at a repetition rate of 10 MHz or more is also possible by carrying out Q-switch operation, mode locking, or the like. When pulsed oscillation at a repetition rate of 10 MHz or more is carried out, the semiconductor film is irradiated with the next pulse after melting of the semiconductor film by laser and before solidification thereof. Accordingly, differing from a case of using a pulsed laser at a lower repetition rate, the solid-liquid interface can be continuously moved in the semiconductor film, and a crystal grain grown continuously toward the scanning direction can be obtained.

In the case of performing crystallization with the use of the continuous wave laser or the laser beam which oscillates at a repetition rate of 10 MHz or more as described above, a surface of the crystallized semiconductor film can be planarized. As a result, a gate insulating film 705 that is formed afterwards can be thinned. In addition, this contributes to improve pressure resistance of the gate insulating film.

The use of ceramic (polycrystal) as a medium allows the medium to be formed into a free shape at low cost in a short time. Although a columnar medium of several mm in diameter and several tens of mm in length is usually used in the case of using single crystal, larger mediums can be formed in the case of using ceramic.

Since the concentration of the dopant such as Nd or Yb in the medium, which directly contributes to light emission, is difficult to be changed significantly both in single crystal and polycrystal, improvement in laser output by increasing the concentration of the dopant has a certain level of limitation. However, in the case of ceramic, drastic improvement in output can be expected because the size of the medium can be significantly increased compared with the case of single crystal.

Further, in the case of using ceramic, a medium having a parallelepiped shape or a rectangular parallelepiped shape can be easily formed. When a medium having such a shape is used and oscillation light goes in zigzag in the medium, an oscillation light path can be longer. Accordingly, amplification is increased and oscillation with high output is possible. Since a laser beam emitted from the medium having such a shape has a cross section of a quadrangular shape when being emitted, a linear beam can be easily shaped compared with the case of a circular beam. The laser beam emitted in such a manner is shaped by using an optical system; accordingly, a linear beam having a short side of 1 mm or less and a long side of several mm to several m can be easily obtained. In addition, by uniformly irradiating the medium with excited light, a linear beam has a uniform energy distribution in a long side direction.

By irradiating the semiconductor film with this linear beam, the semiconductor film can be heated more uniformly. In a case where uniform heating is required from one end to the other end of the linear beam, slits may be provided for the both ends so as to shield a portion where energy is attenuated.

When thus obtained linear beam with uniform intensity is used to heat the semiconductor film and this semiconductor film is used to manufacture a semiconductor device, the semiconductor device can have favorable and uniform characteristics.

Next, the gate insulating film 705 is formed to cover the crystalline semiconductor films 706 to 710. The gate insulating film 705 may be formed by a sputtering method or various CVD methods such as a plasma CVD method. Specifically, a silicon oxide film (a $SiO_x$ film), a silicon nitride film (a $SiN_x$ film), a silicon oxide film containing nitrogen (a $SiO_xN_y$ film) (x>y) (x and y are positive integers), or a silicon nitride film containing oxygen (a $SiN_xO_y$ film) (x>y) (x and y are positive integers) is formed as a single layer structure, or these films described above are appropriately stacked. In addition, by performing high-density plasma treatment in an atmosphere containing oxygen, nitrogen, or oxygen and nitrogen to the crystalline semiconductor films 706 to 710, the surfaces of the crystalline semiconductor films 706 to 710 may be oxidized or nitrided to form a gate insulating film. By the high-density plasma treatment, the gate insulating film can be uniform in thickness, film quality, and the like and dense compared with a film formed by a CVD method, a sputtering method, or the like.

In this specification, "high-density plasma treatment" is characterized in that the electron density of plasma is $1\times10^{11}$ $cm^{-3}$ or more and $1\times10^{13}$ $cm^{-3}$ or less and the electron temperature of plasma is 0.5 eV or more and 1.5 eV or less. When the description of "high-density plasma treatment" appears alone in this specification hereinafter, the description means the plasma treatment under the above-described conditions. Although the electron density of plasma is high, plasma damage to the substrate can be prevented. This is because the electron temperature in the vicinity of an object to be processed (a metal film) formed over the substrate is low. In addition, since the electron density of plasma is as high as $1\times10^{11}$ $cm^{-3}$ or more, the oxide formed by oxidation treatment is superior in uniformity of a thickness and it is also possible to form a dense film. Further, since the electron temperature of plasma is as low as 1.5 eV or less, the oxidation treatment can be performed at a lower temperature compared with the case of plasma treatment or a thermal oxidation method. For example, the plasma oxidation treatment can be performed sufficiently even when the plasma treatment is performed at a temperature lower than a strain point of a glass substrate by 100° C. or more (typically, temperatures of 250 to 550° C.). As a frequency for generating plasma, a microwave (2.45 GHz) is used. In addition, potential of plasma is as low as 5 V or less; thus, excessive dissociation of raw material molecules can be suppressed.

As the atmosphere containing oxygen, a mixed gas of oxygen ($O_2$), nitrogen dioxide ($NO_2$), or dinitrogen monoxide ($N_2O$) and a rare gas; or a mixed gas of oxygen ($O_2$), nitrogen dioxide ($NO_2$), or dinitrogen monoxide ($N_2O$), and a rare gas and hydrogen ($H_2$) can be used. As the atmosphere containing nitrogen, a mixed gas of nitrogen ($N_2$) or ammonia ($NH_3$) and a rare gas; or a mixed gas of nitrogen ($N_2$) or ammonia ($NH_3$), and a rare gas and hydrogen ($H_2$) can be used. The surfaces of the crystalline semiconductor films 706 to 710 can be oxidized or nitrided by oxygen radicals (including OH radicals in some cases) or nitrogen radicals (including NH radicals in some cases) generated by high density plasma.

When the gate insulating film 705 is formed by performing the high-density plasma treatment, an insulating film having a thickness of 1 to 20 nm, typically 5 to 10 nm, is formed over the crystalline semiconductor films 706 to 710. A reaction in this case is a solid-phase reaction; therefore, interface state density between the insulating film and the crystalline semiconductor films 706 to 710 can be extremely reduced. Further, since the crystalline semiconductor films 706 to 710 are directly oxidized or nitrided, variations in thickness of the formed gate insulating film 705 can be significantly suppressed, which is ideal. Furthermore, since strong oxidation does not occur in a crystal grain boundary of crystalline silicon, an extremely preferable state is obtained. That is, solid-phase oxidation of the semiconductor film surface by the high-density plasma treatment shown here allows an insulating film with low interface state density and good uniformity to be formed without causing an abnormal oxidation reaction in a crystal grain boundary.

It is to be noted that, as the gate insulating film 705, only the insulating film formed by the high-density plasma treatment may be used. Alternatively, the insulating film formed by the high-density plasma treatment and another insulating film of silicon oxide, silicon nitride containing oxygen, or silicon oxide containing nitrogen may be stacked by a CVD method utilizing plasma or a thermal reaction. In either case, when a transistor is formed to have a gate insulating film which partly or entirely includes the insulating film formed by high-density plasma, variations in characteristics can be reduced.

In addition, the crystalline semiconductor films 706 to 710 formed by crystallizing the amorphous semiconductor film 704 by irradiation of a continuous wave laser or a laser beam which oscillates at a repetition rate of 10 MHz or more while scanning in one direction have a characteristic that crystal grows in a scanning direction of the beam. Therefore, when a transistor is arranged such that the scanning direction corresponds to a channel length direction (a direction in which carriers flow when a channel forming region is formed) and the gate insulating film 705 formed by the high-density plasma treatment is used, a transistor with less variations in characteristics and high electron field-effect mobility can be obtained.

Subsequently, a first conductive film and a second conductive film are stacked over the gate insulating film 705. The first conductive film and the second conductive film may be each formed by a sputtering method or various CVD methods such as a plasma CVD method. In this embodiment, the first conductive film is formed to have a thickness of 20 to 100 nm, and the second conductive film is formed to have a thickness of 100 to 400 nm. The first conductive film and the second conductive film can be formed by using an element selected from tantalum (Ta), tungsten (W), titanium (Ti), molybdenum (Mo), aluminum (Al), copper (Cu), chromium (Cr), niobium (Nb), and the like, or an alloy material or a compound material containing these elements as its main component. Alternatively, a semiconductor material typified by polycrystalline silicon doped with an impurity element such as phosphorus can be used. As an example of the combination of the first conductive film and the second conductive film, a tantalum nitride (TaN) film and a tungsten (W) film, a tungsten nitride (WN) film and a tungsten film, a molybdenum nitride (MoN) film and a molybdenum (Mo) film, or the like can be given. Since tungsten or tantalum nitride has high heat resistance, heat treatment can be performed in order to perform thermal activation after the first conductive film and the second conductive film are formed. In addition, a single layer structure or a three layer structure may be employed instead of the two layer structure of the first conductive film and the second conductive film. In a case of employing the single layer structure or the three layer structure, a similar material to that of the first conductive film or the second conductive film described above can be freely selected as a material of a conductive film.

Next, a resist mask is formed by a photolithography method and etching treatment for forming a gate electrode and a gate line is performed to form conductive films (hereinafter, also referred to as gate electrodes in this specification) 716 to 725 each functioning as a gate electrode.

Then, a resist mask is newly formed by a photolithography method. Thereafter, an impurity element imparting N-type conductivity is added into the crystalline semiconductor films 706 and 708 to 710 at a low concentration by an ion doping method or an ion implantation method. Thus, N-type impurity regions 711 and 713 to 715 and channel forming regions 780 and 782 to 784 are formed. An element belonging to Group 15 of the periodic table may be used as the impurity element imparting N-type conductivity, and for example, phosphorus (P) or arsenic (As) is used.

Subsequently, a resist mask is formed by a photolithography method. Thereafter, an impurity element imparting P-type conductivity is added into the crystalline semiconductor film 707 to form a P-type impurity region 712 and a channel forming region 781. For example, boron (B) is used as the impurity element imparting P-type conductivity. It is to be noted that, as for the order of forming the N-type impurity regions 711 and 713 to 715 and the P-type impurity region 712, the P-type impurity region 712 may be formed after forming the N-type impurity regions 711 and 713 to 715 as described in this embodiment, or the N-type impurity regions 711 and 713 to 715 may be formed after forming the P-type impurity region 712.

Figure 7B:
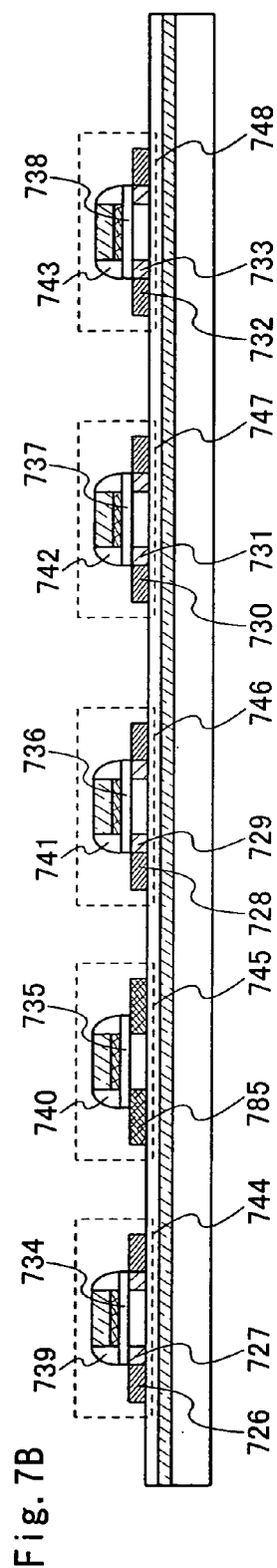

Next, an insulating film is formed so as to cover the gate insulating film 705 and the conductive films 716 to 725. The insulating film is formed as a single layer or a stacked layer using a film formed of an inorganic material such as silicon, oxide of silicon, or nitride of silicon, or a film formed of an organic material such as an organic resin by a sputtering method or various CVD methods such as a plasma CVD method. Then, the insulating film is selectively etched by anisotropic etching mainly in a perpendicular direction to form insulating films (also referred to as sidewalls) 739 to 743 in contact with side surfaces of the conductive films 716 to 725 (FIG. 7B). Concurrently with manufacturing the insulating films 739 to 743, insulating films (hereinafter also referred to as gate insulating films) 734 to 738 are formed by etching the gate insulating film 705. The insulating films 739 to 743 are used as masks for doping when forming an LDD (Lightly Doped Drain) region afterwards.

Then, a resist mask is formed by a photolithography method. Using the resist mask and the insulating films 739 to 743 as masks, an impurity element imparting N-type conductivity is added into the crystalline semiconductor films 706 and 708 to 710 so that first N-type impurity regions (also referred to as LDD regions) 727, 729, 731 and 733 and second N-type impurity regions 726, 728, 730 and 732 are formed. The concentration of the impurity element in the first N-type impurity regions 727, 729, 731 and 733 is lower than the concentration of the impurity element in the second N-type impurity regions 726, 728, 730 and 732. Through the above-described steps, N-type thin film transistors 744 and 746 to 748 and a P-type thin film transistor 745 are completed.

There are the following two methods for forming the LDD region. In one method, a gate electrode with a stacked structure having two or more layers is formed, etching so that the gate electrode has a tapered shape or anisotropic etching is performed, and a conductive film of a lower layer included in the gate electrode is used as a mask. In the other method, a sidewall insulating film is used as a mask. A thin film transistor that is formed by the former method has a structure in which an LDD region is overlapped with a gate electrode with a gate insulating film interposed therebetween. However, in this structure, since etching so that the gate electrode has a tapered shape or anisotropic etching is utilized, it is difficult to control the width of the LDD region, and the LDD region cannot be formed in some cases if the etching step is not performed preferably. On the other hand, the latter method which uses a sidewall insulating film as a mask is, as compared to the former method, easier to control the width of the LDD region and can form the LDD region certainly. It is to be noted that "etching so that the gate electrode has a tapered shape" means to perform etching so as to form a side surface of the gate electrode into a tapered shape.

Subsequently, after removing a natural oxide film formed over a surface of each of the exposed N-type impurity regions 726, 728, 730 and 732 and the P-type impurity region 785, a silicide region may be formed appropriately using a metal film. As the metal film, a nickel film, a titanium film, a cobalt film, a platinum film, a film made of an alloy containing at least two kinds of these elements, or the like can be used. More specifically, for example, a nickel film is used as the metal film and the silicide region is formed by heat treatment after forming the nickel film at a room temperature with a deposition power of 500 W to 1 kW by a sputtering method. As the heat treatment, RTA, furnace annealing, or the like can be used. At this time, by controlling the thickness of the metal film, a heating temperature, and heating time, it is possible to form the silicide region only over the surfaces of the N-type impurity regions 726, 728, 730 and 732 and the P-type impurity region 785, or the silicide region can be entirely formed in the N-type impurity regions 726, 728, 730 and 732 and the P-type impurity region 785. Lastly, nickel which has not reacted is removed. For example, nickel which has not reacted is removed by using an etching solution composed of HCl: $HNO_3:H_2O=3:2:1$.

It is to be noted that this embodiment shows an example in which each of the thin film transistors 744 to 748 is a top-gate type; however, it is obvious that each of the thin film transistors may be a bottom-gate type. In addition, a single gate structure in which a single channel forming region is formed in each of the thin film transistors 744 to 748 is described; however, a double-gate structure in which two channel forming regions are formed or a triple-gate structure in which three channel forming regions are formed may also be employed. Alternatively, a dual gate structure having two gate electrodes which are arranged above and below a channel forming region with a gate insulating film interposed therebetween, or other structure may be employed.

In addition, the semiconductor film included in each of the thin film transistors 744 to 748 may have a structure other than the structure described in this embodiment. For example, an impurity region (including a source region, a drain region, and an LDD region) may be formed, or a p-channel TFT, an n-channel TFT, or a CMOS circuit may be formed. Further, an insulating film (sidewall) may be formed so as to be in contact with a side surface of a gate electrode which is provided above or below a semiconductor film.

Through the above steps, the N-type thin film transistors 744 and 746 to 748 and the P-type thin film transistor 745 are completed. Thereafter, heat treatment may be performed in order to recover the crystallinity of the semiconductor film or activate the impurity element which has been added into the semiconductor film.

Figure 7C:
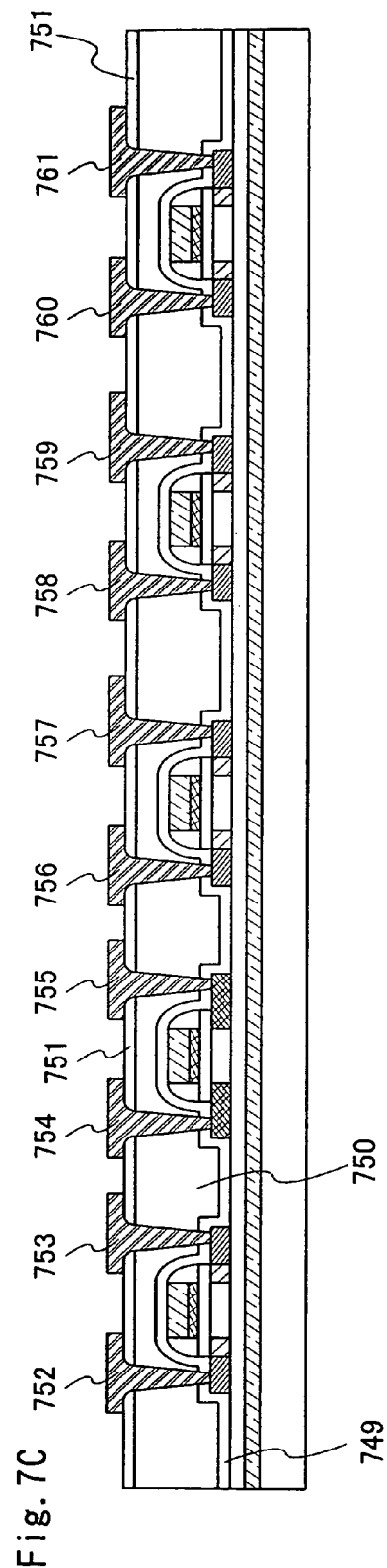

Next, an insulating film is formed as a single layer or a stacked layer so as to cover the thin film transistors 744 to 748 (FIG. 7C). The insulating film that covers the thin film transistors 744 to 748 is formed as a single layer or a stacked layer using an inorganic material such as oxide of silicon or nitride of silicon, an organic material such as polyimide, polyamide, benzocyclobutene, acrylic, epoxy, or siloxane, or the like by an SOG method, a droplet-discharging method, or the like. In this specification, siloxane has a skeletal structure formed of the bond of silicon (Si) and oxygen (O), in which an organic group containing at least hydrogen (for example, an alkyl group or aromatic hydrocarbon) is used as a substituent. Alternatively, a fluoro group, or an organic group containing at least hydrogen and a fluoro group may be used as the substituent. For example, in a case where the insulating film that covers the thin film transistors 744 to 748 has a three layer structure, a film containing silicon oxide as its main component may be formed as an insulating film 749 in a first layer, a film containing a resin as its main component may be formed as an insulating film 750 in a second layer, and a film containing silicon nitride as its main component may be formed as an insulating film 751 in a third layer. In addition, in a case where the insulating film that covers the thin film transistors 744 to 748 has a single layer structure, a silicon nitride film or a silicon nitride film containing oxygen may be formed. At this time, preferably, hydrogen may be made to be contained in the surface of the silicon nitride film or the silicon nitride film containing oxygen by performing high-density plasma treatment to the silicon nitride film or the silicon nitride film containing oxygen in an atmosphere containing hydrogen. This is because this hydrogen can be utilized in performing a subsequent step of hydrogenating the semiconductor film. Alternatively, the semiconductor film can be hydrogenated by performing high-density plasma treatment in an atmosphere containing hydrogen while heating the substrate at temperatures of 350 to 450° C. It is to be noted that, as the atmosphere containing hydrogen, a mixed gas of hydrogen ($H_2$) or ammonia ($NH_3$) and a rare gas (for example, argon (Ar)) can be used. When the mixed gas of ammonia ($NH_3$) and a rare gas (for example, argon (Ar)) is used as the atmosphere containing hydrogen, the surfaces of the gate insulating films 734 to 738 can be nitrided as well as hydrogenated at the same time.

Before forming the insulating films 749 to 751 or after forming one or a plurality of thin films among the insulating films 749 to 751, heat treatment may be performed in order to recover the crystallinity of the semiconductor film, activate the impurity element which has been added into the semiconductor film, or hydrogenate the semiconductor film. As for the heat treatment, a thermal annealing method, a method using a laser, an RTA method, or the like may be adopted. For example, in order to activate the impurity element, thermal annealing at 500° C. or more may be performed. Alternatively, in order to hydrogenate the semiconductor film, thermal annealing at temperatures of 350 to 450° C. may be performed.

Then, the insulating films 749 to 751 are etched by a photolithography method to form contact holes which expose the N-type impurity regions 726, 728, 730 and 732 and the P-type impurity region 785. Subsequently, a conductive film is formed so as to fill the contact holes, and the conductive film is patterned to form conductive films 752 to 761, each of which functions as a source or drain wiring.

The conductive films 752 to 761 are formed using a conductive film containing aluminum (Al) as its main component by a sputtering method or various CVD methods such as a plasma CVD method. The conductive film containing aluminum (Al) as its main component corresponds to a material containing aluminum as its main component and nickel, or an alloy material containing aluminum as its main component, nickel, and one or both of carbon and silicon, for example. A conductive film containing aluminum as its main component generally has difficulty in heat resistance; therefore, it is preferable to have a structure where the conductive film containing aluminum as its main component is interposed between barrier films. The barrier film corresponds to a film having a function of suppressing a hillock of the conductive film containing aluminum as its main component or increasing heat resistance, and chromium, tantalum, tungsten, molybdenum, titanium, silicon, nickel or nitride thereof can be given as an example of a material having such a function.

As an example of a structure of the conductive films 752 to 761, a structure where a titanium film, an aluminum film, and a titanium film are sequentially stacked from the substrate side can be given. A titanium film is formed of an element having a high reducing property; therefore, even when a thin natural oxide film is formed over the crystalline semiconductor film, the natural oxide film can be reduced so that preferable contact with the crystalline semiconductor film can be obtained. In addition, by performing high-density plasma treatment to the titanium film formed between the crystalline semiconductor film and the aluminum film in an atmosphere containing nitrogen, the surface is preferably nitrided. As the atmosphere containing nitrogen, a mixed gas of $N_2$ or $NH_3$ and a rare gas, or a mixed gas of $N_2$ or $NH_3$, a rare gas, and $H_2$ may be used. By nitriding the surface of the titanium film, titanium and aluminum are prevented from being alloyed in a subsequent step of heat treatment or the like, and aluminum can be prevented from being diffused in the crystalline semiconductor film by penetrating the titanium film. Although an example where the aluminum film is interposed between the titanium films is explained here, the same thing can be said for a case where a chromium film, a tungsten film, or the like is used instead of the titanium film. More preferably, formation of the titanium film, nitriding treatment of the titanium film surface, formation of the aluminum film, and formation of the titanium film are performed continuously without being exposed to atmosphere by using a multi chamber apparatus.

Subsequently, an insulating film 762 is formed so as to cover the conductive films 752 to 761 (FIG. 8A). The insulating film 762 is formed as a single layer or a stacked layer using an inorganic material or an organic material by an SOG method, a droplet-discharging method, or the like. In this embodiment, the insulating film 762 is formed to have a thickness of 0.75 to 3 µm.

Then, the insulating film 762 is etched by a photolithography method to form a contact hole so as to expose the conductive film 761. Subsequently, conductive films 763 are formed over the insulating film 762 and so as to fill the contact hole. Since the conductive films 763 each function as an antenna, the conductive films 763 may be each also hereinafter referred to as "an antenna". The conductive film 763 may have a stacked structure without being limited to a single layer structure.

The shape of the conductive film 763 functioning as an antenna is explained. As a transmission method of a signal in a semiconductor device capable of non-contact data communication (RFID tag) including an antenna (conductive film 763), an electromagnetic coupling method, an electromagnetic induction method, a microwave method, or the like can be used. The transmission method can be appropriately selected by those implementing the invention by considering the usage pattern, and the most suitable antenna in accordance with the transmission method may be appropriately provided.

For example, in a case where an electromagnetic coupling method or an electromagnetic induction method (for example, a frequency band of 13.56 MHz) is used as the transmission method of a signal in a semiconductor device, in order to utilize electromagnetic induction due to the change of magnetic field density, the conductive film functioning as an antenna is formed into a loop shape (for example, a loop antenna) or a spiral shape.

In a case where a microwave method (for example, the UHF band (a frequency band of 860 to 960 MHz), a frequency band of 2.45 GHz, or the like) is used as the transmission method of a signal in a semiconductor device, the shape such as the length of the conductive film functioning as an antenna may be appropriately set in consideration of a wavelength of an electromagnetic wave used in the transmission of a signal. For example, the conductive film 763 can be formed into a linear shape (for example, a dipole antenna) or a planar shape (for example, a patch antenna). In addition, the shape of the conductive film 763 is not limited to a linear shape and may have a curved shape, a meander shape, or a shape in which these shapes are combined in consideration of the wavelength of the electromagnetic wave.

Next, a formation method and a material of the conductive film 763 functioning as an antenna is explained. As the formation method of the conductive film 763, a CVD method, a sputtering method, a printing method such as screen printing or gravure printing, a droplet-discharging method, a dispenser method, a plating method, or the like can be used. As the material for the conductive film 763, an element selected from aluminum (Al), titanium (Ti), silver (Ag), copper (Cu), gold (Au), platinum (Pt), nickel (Ni), palladium (Pd), tantalum (Ta) and molybdenum (Mo), or an alloy material or a compound material containing the element as its main component can be used. In addition, fine particles containing solder (preferably, lead-free solder) as its main component may be used, and in this case, fine particles having a diameter of 20 µm or less are preferably used. Solder has an advantage of low cost. In addition, ceramic, ferrite, or the like can be used for the antenna.

For example, in a case of forming the conductive film 763 by a screen printing method, the conductive film 763 can be provided by selectively printing a conductive paste in which conductive particles having a diameter of several nm to several tens of µm are dissolved or dispersed in an organic resin. As the conductive particles, one or more metal particles of silver (Ag), gold (Au), copper (Cu), nickel (Ni), platinum (Pt), palladium (Pd), tantalum (Ta), molybdenum (Mo), and titanium (Ti), fine particles of silver halide, or dispersible nanoparticles can be used. In addition, as the organic resin contained in the conductive paste, one or a plurality of organic resins functioning as a binder of metal particles, a solvent, a dispersant, and a coating material can be used. Typically, an organic resin such as an epoxy resin or a silicon resin can be given. In addition, in forming the conductive film 763, it is preferable that baking be performed after pressing and pushing out the conductive paste. For example, in a case where fine particles containing silver as its main component (for example, a diameter of 1 nm or more and 100 nm or less) are used as a material for the conductive paste, the conductive film 763 can be formed by baking the paste at temperatures of 150 to 300° C. so as to be cured.

In addition, when an electromagnetic coupling method or an electromagnetic induction method is employed and a semiconductor device including an antenna (RFID tag) is provided to be in contact with metal, it is preferable that a magnetic material having magnetic permeability be provided between the semiconductor device and the metal. In a case where the semiconductor device including an antenna is provided to be in contact with metal, eddy current flows into the metal in accordance with the change of magnetic field, the change of magnetic field becomes smaller due to the eddy current, and communication range is reduced. Accordingly, by providing the material having magnetic permeability between the semiconductor device and the metal, eddy current to the metal can be suppressed and the reduction of the communication range can be suppressed. It is to be noted that ferrite or a thin metal film, which has high magnetic permeability and small radio frequency loss, can be used as the magnetic material.

Through the above steps, an element layer is completed.

Figure 9:
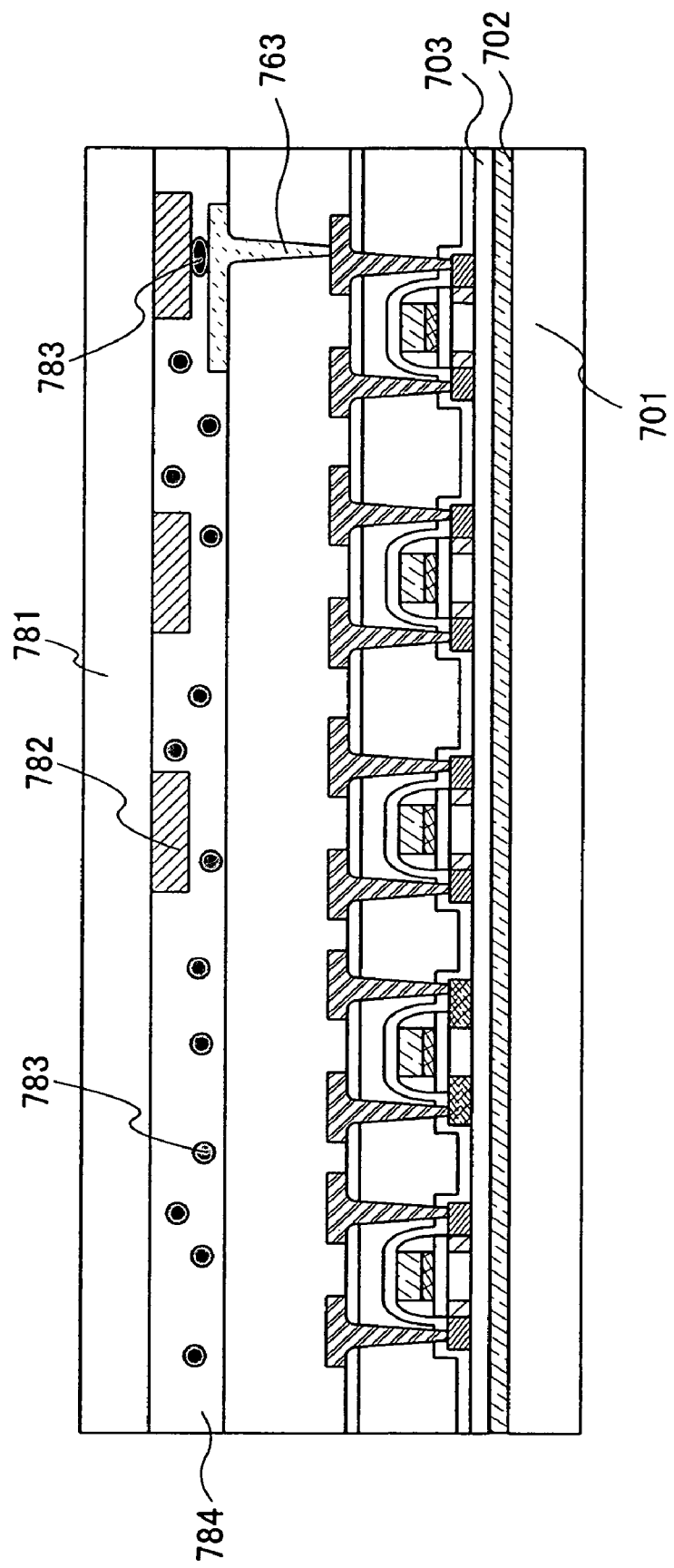
FIG. 9 is a view showing a manufacturing method of a semiconductor device according to the present invention (Embodiment 1)

In this embodiment, a structure where the antenna (conductive film 763) is formed as part of the element layer is described; however, a base material provided with an antenna may be separately prepared and a structure in which the base material provided with the antenna and the substrate provided with the element layer are attached may also be employed. In other words, as shown in FIG. 9, a base material 781 provided with an antenna 782 and a substrate 701 provided with an element layer may be attached. In FIG. 9, an anisotropic conductive material is used as an attachment means. The anisotropic conductive material contains conductive particles 783 and a fluid, and the fluid is cured by baking to become an adhesive layer 784. A conductive film 763 and the antenna 782 can be electrically continuous by pressure bonding of the conductive particle 783. In other regions, since the conductive particles 783 have a sufficient distance therebetween, electrical connection is not made. Other than the method of attachment using the anisotropic conductive material, a method of bonding metal and metal by using ultrasonic waves (referred to as ultrasonic bonding) or a method of attachment by using an ultraviolet curable resin or a two-sided tape can also be employed. In FIG. 9, the conductive film 763 functions as a wiring for electrically connecting the antenna 782 and a thin film transistor.

Next, an insulating film 772 is formed by an SOG method, a droplet-discharging method, or the like so as to cover the conductive films 763 each functioning as an antenna (FIG. 8B). The insulating film 772 functions as a protective layer for ensuring the strength of the element layer. The insulating film 772 is preferably formed so as to cover side surfaces of the base film 703 and the element layer as well. In this embodiment, the insulating film 772 is formed over the entire surface of the base film 703 and the element layer so as to cover the base film 703 and the element layer; however, the insulating film 772 is not necessarily formed over the entire surface, and may be selectively formed. In addition, the present invention can be implemented even when the insulating film 772 is not provided.

The insulating film 772 may be formed by using a film containing carbon such as DLC (diamond like carbon), a silicon oxide film containing nitrogen, a silicon nitride film containing oxygen, a film formed of an organic material (for example, a film formed of a resin material such as epoxy), or the like. As a formation method of the insulating film 772, a sputtering method, various CVD methods such as a plasma CVD method, a spin coating method, a droplet-discharging method, or a screen printing method can be used.

As for subsequent steps after forming the insulating film 772 (the protective layer), the method described in Embodiment Mode 1 or Embodiment Mode 2 may be applied. In other words, after forming an opening by etching part of the element layer and the insulating film 772, a stacked body including part of the element layer and the insulating film 772 may be peeled from the substrate. Then, the stacked body is sealed with a first stacked film and a second stacked film each including an adhesive layer and a base material, and the adhesive layer is sealed with a first base material and a second base material. In such a manner, a semiconductor device is completed.

This embodiment can be implemented by freely combining with the above embodiment modes. In other words, materials or formation methods described in the above embodiment modes can be used in this embodiment, and materials or formation methods described in this embodiment can be used in the above embodiment modes.

Embodiment 2

In this embodiment, a structure of a semiconductor device, in which a base material provided with antennas having various shapes and a chip including an integrated circuit (hereinafter referred to as a chip) are connected and the base material and the chip are sealed with a stacked film, will be explained.

Figure 10A:
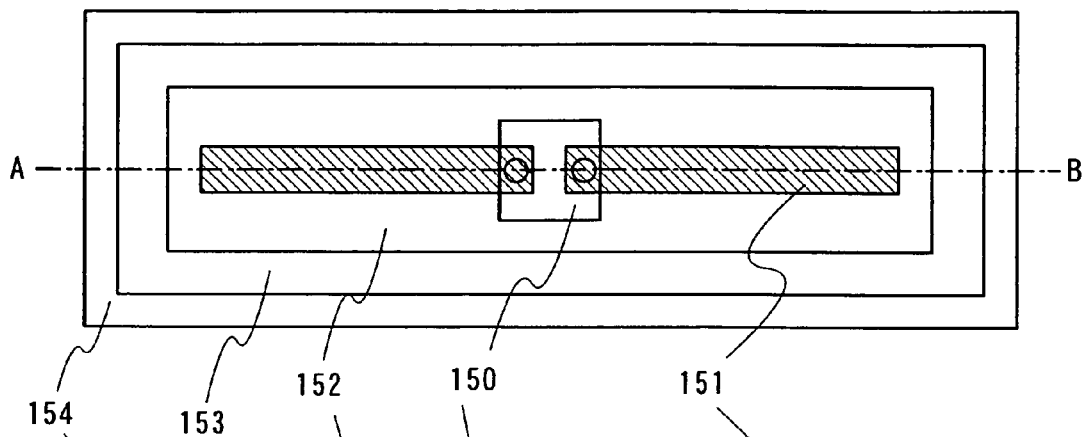
FIGS. 10A to 10C are views each showing a manufacturing method of a semiconductor device according to the present invention (Embodiment 2)

A structure of a semiconductor device using a dipole antenna as one shape of an antenna is explained with reference to FIGS. 10A to 10C. FIG. 10A is a top view of a semiconductor device, and FIG. 10B is a cross-sectional view taken along A-B of FIG. 10A.

A chip 150 provided with an integrated circuit is electrically connected to a dipole antenna 151 provided over a base material 152. For example, as shown in FIG. 10C, the dipole antenna 151 is connected to an active layer of a thin film transistor through a first conductive film 161, a second conductive film 162, and conductive particles 163. The chip 150 and the base material 152 provided with the dipole antenna 151 are attached to each other by using the conductive particles 163 and an anisotropic conductive material having a fluid. The fluid is cured by baking to be an adhesive layer 164.

It is to be noted that a method for electrically connecting the chip 150 and the dipole antenna 151 is not limited to the method using an anisotropic conductive material, and a method using conductive adhesive or a TAB (Tape Automated Bonding) method may also be used.

Figure 10B:
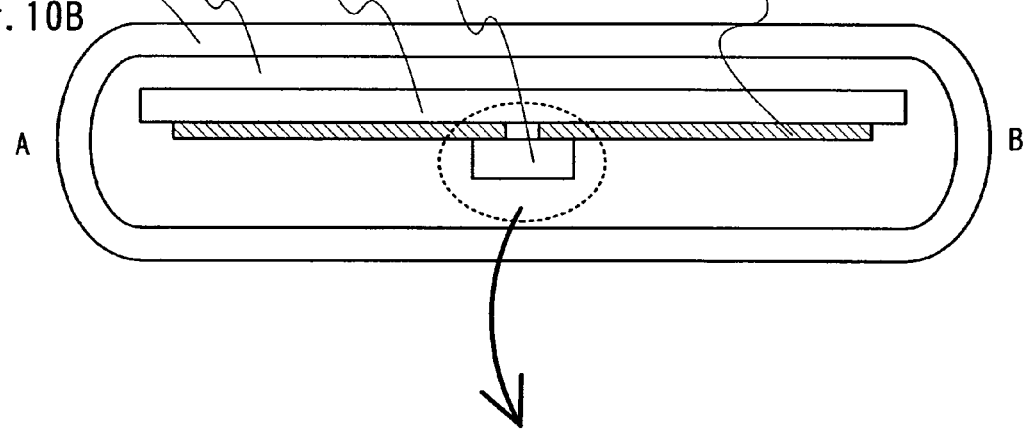
Figure 10C:
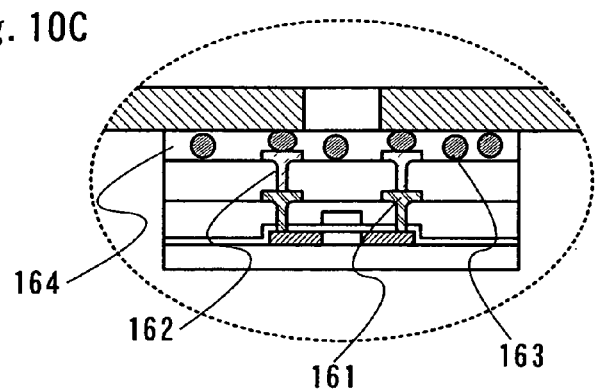

In this embodiment, as shown in FIG. 10B, the dipole antenna 151, only one surface of which is adhered to the base material 152, is used. However, the dipole antenna 151, the other surface (except for a region with electrical continuity to the chip 150) and the side surface of which are adhered to the base material, that is, the dipole antenna 151 which is not exposed to the outside except for a region with electrical continuity to the chip 150 can also be used.

The chip 150 and the base material 152 are sealed with two stacked films. As a sealing method, the method described in Embodiment Mode 1 or Embodiment Mode 2 may be used. In such a manner, the chip 150 and the base material 152 are sealed with a base material 154 with an adhesive layer 153 interposed therebetween. Since not only the chip 150 but also the adhesive layer 153 adhered to the chip 150 is sealed with the base material 154, in a semiconductor device manufactured by the present invention, moisture or a substance causing contamination can be prevented from entering, and thus, chemical and physical strength and circumstance resistance are excellent.

A structure of a semiconductor device using a loop antenna as one shape of an antenna is explained with reference to FIGS. 11A and 11B. FIG. 11A is a top view of a semiconductor device, and FIG. 11B is a cross-sectional view taken along A-B of FIG. 11A.

A chip 250 provided with an integrated circuit is electrically connected to a loop antenna 251 provided over a base material 252. In addition, the chip 250 and the base material 252 are sealed with two stacked films. As a sealing method, the method described in Embodiment Mode 1 or Embodiment Mode 2 may be used. In such a manner, the chip 250 and the base material 252 are sealed with a base material 254 with an adhesive layer 253 interposed therebetween. Since not only the chip 250 but also the adhesive layer 253 adhered to the chip 250 is sealed with the base material 254, in a semiconductor device manufactured by the present invention, moisture or a substance causing contamination can be prevented from entering, and thus, chemical and physical strength and circumstance resistance are excellent.

Figure 12A:
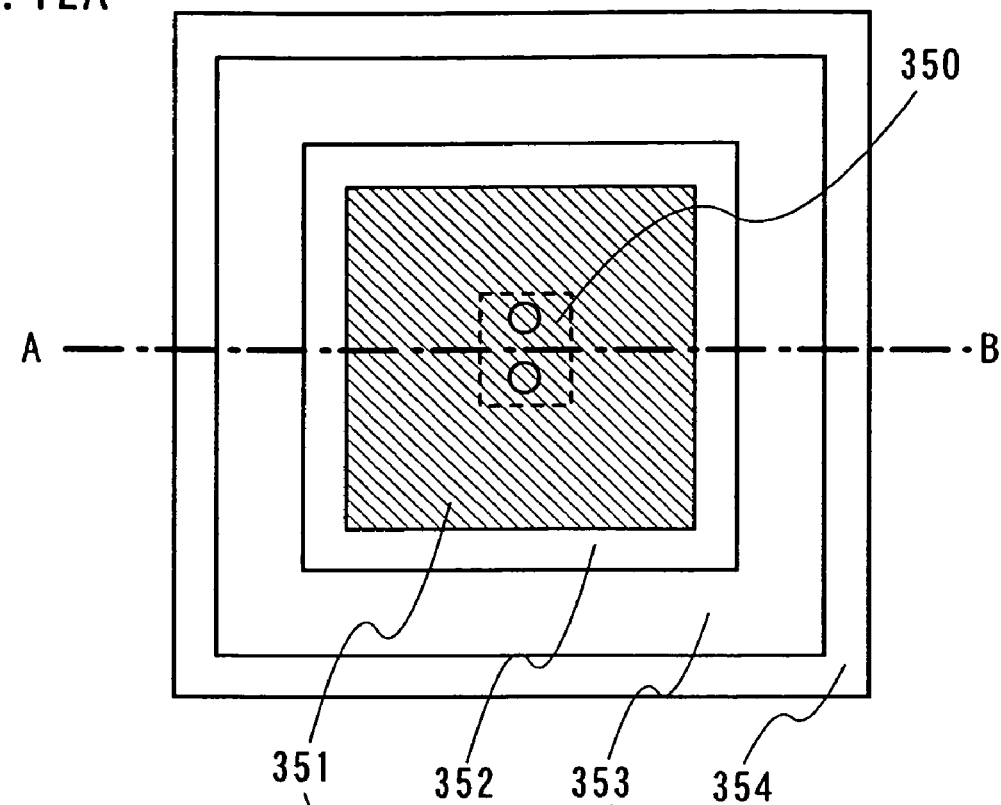
FIGS. 12A and 12B are views each showing a manufacturing method of a semiconductor device according to the present invention (Embodiment 2)
Figure 12B:
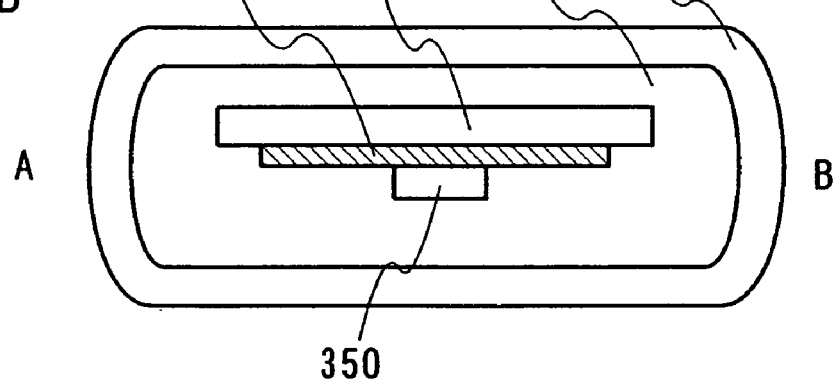

A structure of a semiconductor device using a patch antenna as one shape of an antenna is explained with reference to FIGS. 12A and 12B. FIG. 12A is a top view of a semiconductor device, and FIG. 12B is a cross-sectional view taken along A-B of FIG. 12A.

A chip 350 provided with an integrated circuit is electrically connected to a patch antenna 351 provided over a base material 352. The chip 350 and the base material 352 are sealed with two stacked films. As a sealing method, the method described in Embodiment Mode 1 or Embodiment Mode 2 may be used. In such a manner, the chip 350 and the base material 352 are sealed with a base material 354 with an adhesive layer 353 interposed therebetween. Since not only the chip 350 but also the adhesive layer 353 adhered to the chip 350 is sealed with the base material 354, in a semiconductor device manufactured by the present invention, moisture or a substance causing contamination can be prevented from entering, and thus, chemical and physical strength and circumstance resistance are excellent.

This embodiment can be implemented by freely combining with the above embodiment modes or embodiment. In other words, materials for the base material or the adhesive layer, which are used in the above embodiment modes or embodiment, can be freely used in this embodiment.

Embodiment 3

In this embodiment, one embodiment in a case of utilizing a semiconductor device of the present invention as an RFID tag capable of non-contact data transmission and reception will be explained with reference to FIGS. 13A to 13C.

Figure 13A:
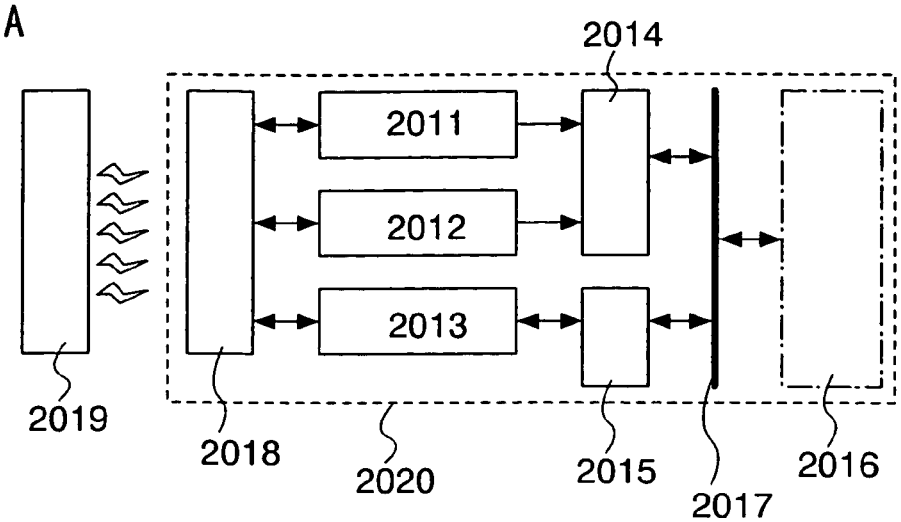
FIGS. 13A to 13C are views each showing a usage pattern of a semiconductor device according to the present invention (Embodiment 3)
Figure 13B:
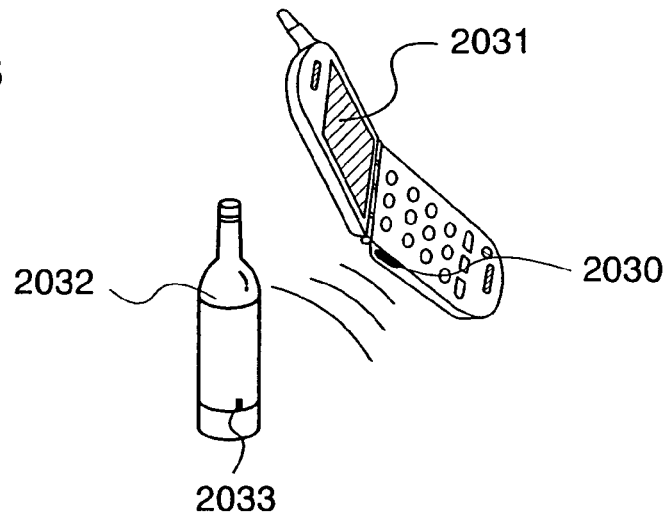
Figure 13C:
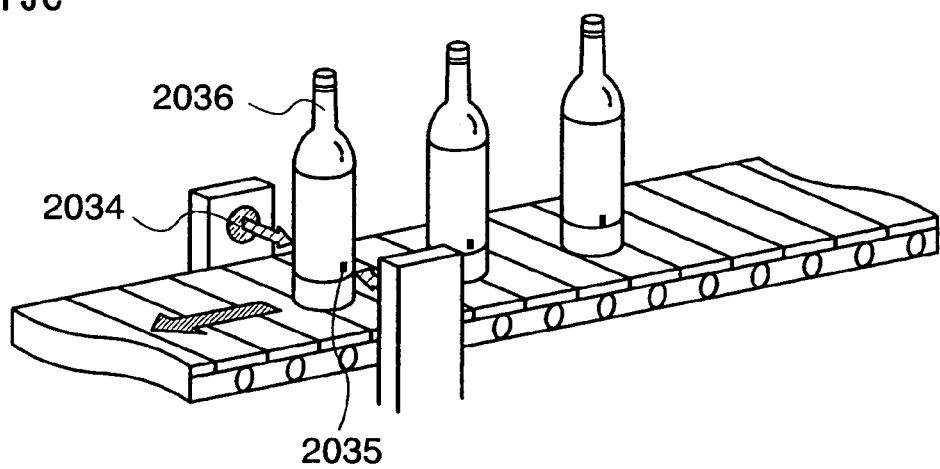

An RFID tag 2020 has a function of communicating data without contact, and includes a power supply circuit 2011, a clock generation circuit 2012, a data demodulation/modulation circuit 2013, a control circuit 2014 for controlling other circuits, an interface circuit 2015, a memory 2016, a data bus 2017, and an antenna (antenna coil) 2018 (FIG. 13A).

The power supply circuit 2011 generates various kinds of power to be supplied to each circuit in the semiconductor device based on an AC signal inputted from the antenna 2018. The clock generation circuit 2012 generates various kinds of clock signals to be supplied to each circuit in the semiconductor device based on an AC signal inputted from the antenna 2018. The data demodulation/modulation circuit 2013 has a function of demodulating/modulating data communicated with a reader/writer 2019. The control circuit 2014 has a function of controlling the memory 2016. The antenna 2018 has a function of transmitting and receiving electromagnetic waves. The reader/writer 2019 communicates with and controls the semiconductor device and controls processing regarding the data thereof. The RFID tag is not limited to the aforementioned structure, and for example, may be additionally provided with other elements such as a limiter circuit of power supply voltage or decoding hardware.

In the RFID tag, power supply voltage may be supplied to each circuit by electric waves without using a power supply (battery) or by using a power supply (battery) instead of electric waves. Alternatively, power supply voltage may be supplied to each circuit by electric waves and a power supply.

It is advantageous to use a semiconductor device of the present invention for an RFID tag or the like, because non-contact communication is possible; multiple reading is possible; writing of data is possible; processing into various shapes is possible; directivity is wide and a wide recognition range is provided depending on the selected frequency; and the like. The RFID tag can be applied to an IC tag which can identify individual information of a person or an article with non-contact wireless communication, a label which can be attached to an article by label processing a wristband for an event or an amusement, or the like. In addition, the RFID tag may be processed using a resin material or may be directly fixed to metal which obstructs wireless communication. Further, the RFID tag can be utilized for the operation of a system such as an entering-leaving management system, a settlement system, or a checkout system of a CD (Compact Disc) or a DVD (Digital versatile Disc).

Next, one mode of actually using the semiconductor device of the present invention as an RFID tag is explained. A reader/writer 2030 is provided on a side of a portable terminal including a display area 2031, and an RFID tag 2033 is provided on a side of an article 2032 (FIG. 13B). In the RFID tag 2033 manufactured in accordance with the present invention, moisture or a substance causing contamination can be prevented from entering, and thus, chemical and physical strength and circumstance resistance are excellent. When the reader/writer 2030 is held to the RFID tag 2033 provided on the article 2032, information related to the article, such as a raw material and a place of origin of the article, a test result in each production process, a history of distribution process, or further, description of the article is displayed on the display area 2031. In addition, a product 2036 can be inspected by using a reader/writer 2034 and an RFID tag 2035 provided on the product 2036 when the product 2036 is transferred on a conveyor belt (FIG. 13C). In the RFID tag 2035 manufactured in accordance with the present invention, moisture or a substance causing contamination can be prevented from entering, and thus, chemical and physical strength and circumstance resistance are excellent. In this manner, by utilizing an RFID tag for a system, information can be easily obtained, and much higher function and high added value are realized.

This embodiment can be implemented by freely combining with the above embodiment modes or embodiments.

Embodiment 4

The semiconductor device of the present invention can be utilized as an RFID tag. For example, the semiconductor device can be used by being provided on paper money, coins, securities, certificates, bearer bonds, packing containers, documents, recording media, commodities, vehicles, foods, garments, health articles, livingwares, medicines, electronic devices, and the like. These examples will be explained with reference to FIGS. 14A to 14H. Reference numeral 2720 in FIGS. 14A to 14H denotes an RFID tag. In the RFID tag manufactured in accordance with the present invention, moisture or a substance causing contamination can be prevented from entering, and thus, chemical and physical strength and circumstance resistance are excellent.

Figure 14A:
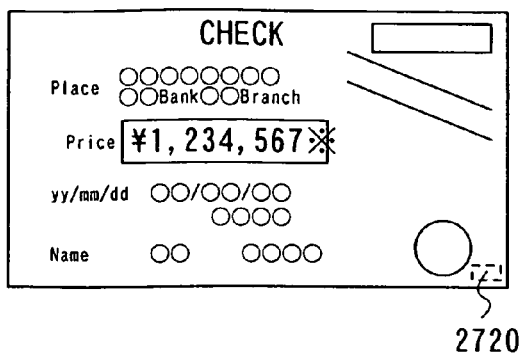
FIGS. 14A to 14H are views each showing a usage pattern of a semiconductor device according to the present invention (Embodiment 4).
Figure 14B:
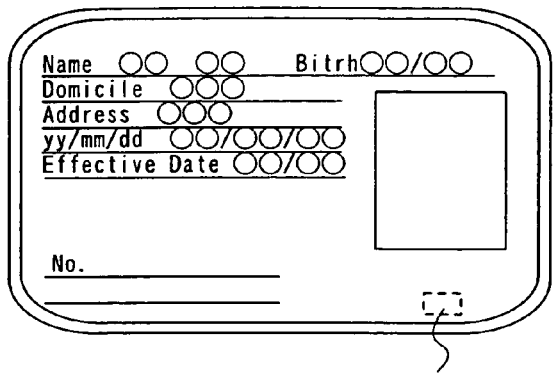
Figure 14C:
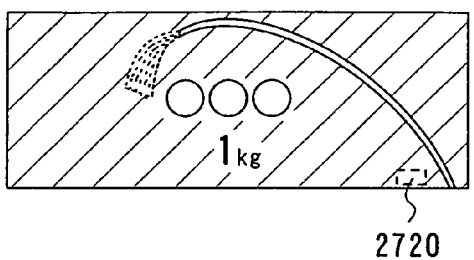
Figure 14D:
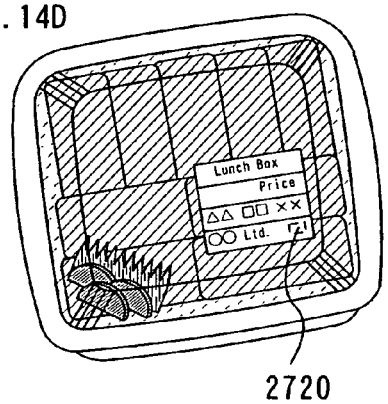
Figure 14E:
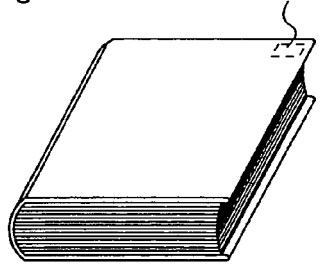
Figure 14F:
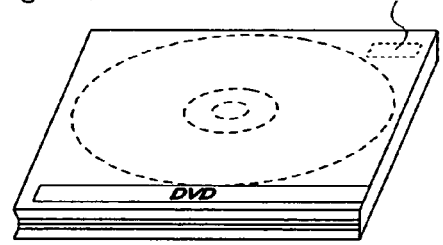
Figure 14G:
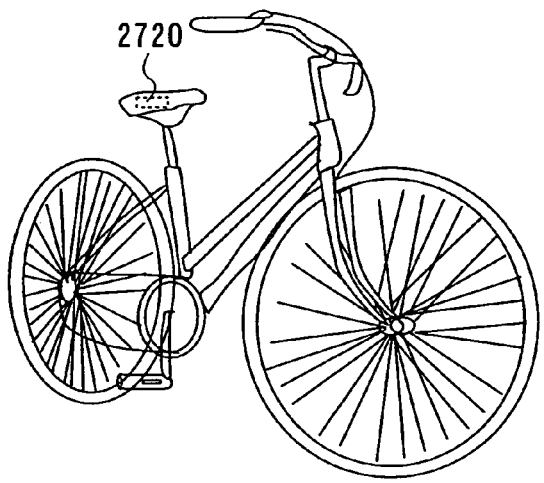
Figure 14H:
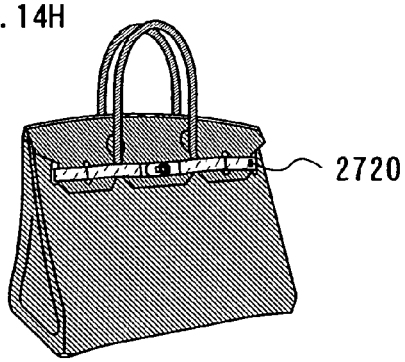

The paper money and coins are money distributed in the market and includes currency (cash vouchers) available in a certain area in a similar way to money, memorial coins, and the like. The securities refer to checks, stock certificates, promissory notes, and the like (FIG. 14A). The certificates refer to driver's licenses, certificates of residence, and the like (FIG. 14B). The bearer bonds refer to stamps, rice coupons, various merchandise coupons, and the like (FIG. 14C). The packing containers refer to wrapping paper for a box lunch or the like, plastic bottles, and the like (FIG. 14D). The documents refer to volumes, books, and the like (FIG. 14E). The recording media refer to DVD software, video tapes, and the like (FIG. 14F). The vehicles refer to wheeled vehicles such as bicycles, vessels, and the like (FIG. 14G). The commodities refer to bags, glasses, and the like (FIG. 14H). The foods refer to eatables, drinks, and the like. The garments refer to clothes, chaussures, and the like. The health articles refer to medical appliances, health appliances, and the like. The livingwares refer to furniture, lighting equipment, and the like. The medicines refer to medical products, pesticides, and the like. The electronic devices refer to liquid crystal display devices, EL display devices, television devices (TV sets or flat-screen TV sets), cellular phones, and the like.

Counterfeits can be prevented by providing an RFID tag on the paper money, coins, securities, certificates, bearer bonds, and the like. The efficiency of an inspection system or a system used in a rental shop can be improved by providing an RFID tag on packing containers, documents, recording media, commodities, foods, livingwares, electronic devices, and the like. By providing an RFID tag on each of the vehicles, health articles, medicines, and the like, counterfeits or theft can be prevented. Further in the case of providing an RFID tag on medicines, medicines can be prevented from being taken mistakenly. In addition, individual creatures can be easily identified by implanting an RFID tag in creatures such as animals. For example, year of birth, sex, breed, and the like can be easily identified by implanting an RFID tag in creatures such as domestic animals.

The RFID tag is provided on goods by being attached on their surfaces or embedded thereinto. For example, the RFID tag may be embedded in paper in the case of a book or embedded in an organic resin in the case of a package formed of the organic resin.

As described above, a semiconductor device according to the present invention can be provided on any goods. This embodiment can be implemented by freely combining with the above embodiment modes or embodiments.

This application is based on Japanese Patent Application serial no. 2005-221140 filed in Japan Patent Office on Jul. 29, 2005, the entire contents of which are hereby incorporated by reference.

What is claimed is:

1. A method for manufacturing a semiconductor device, comprising the steps of:
adhering a first stacked film including a first base material and a first adhesive layer so as to cover one surface of a stacked body including an integrated circuit;
sealing the stacked body by adhering a second stacked film including a second base material and a second adhesive layer so as to cover the other surface of the stacked body;
cutting the first stacked film and the second stacked film so that a side surface of the first stacked film and the second stacked film is exposed, after the step of sealing; and
irradiating the side surface of the first stacked film and the second stacked film with a laser light so that a side surface of the first adhesive layer and the second adhesive layer is sealed with a third base material formed by melting at least one of the first base material and the second base material.

2. The method according to claim 1, wherein an ultraviolet laser, a $CO_2$ laser, or a YAG laser is used as the laser light.

3. The method according to claim 1, wherein the side surface of the first stacked film and the second stacked film, which is exposed by the cutting, is irradiated with the laser light, and the side surface of the first adhesive layer and the second adhesive layer is sealed with the first base material and the second base material.

4. The method according to claim 1, wherein the stacked body has an antenna.

5. The method according to claim 1, wherein the side surface of the first stacked film and the second stacked film, which is exposed by the cutting, is irradiated with the laser light at an incident angle of 30° or more and 80° or less.

6. A method for manufacturing a semiconductor device, comprising the steps of:
forming a peeling layer over a substrate;
forming an element layer including a plurality of integrated circuits over the peeling layer;
forming an insulating film over the element layer;
forming an opening by removing part of the element layer and the insulating film at the same time as forming a stacked body including part of the element layer and the insulating film;
peeling the stacked body from the substrate;
adhering a first stacked film including a first base material and a first adhesive layer so as to cover one surface of the peeled stacked body;
sealing the stacked body by adhering a second stacked film including a second base material and a second adhesive layer so as to cover the other surface of the peeled stacked body;
cutting the first stacked film and the second stacked film so that a side surface of the first stacked film and the second stacked film is exposed, after the step of sealing; and
irradiating the side surface of the first stacked film and the second stacked film with a laser light so that a side surface of the first adhesive layer and the second adhesive layer is sealed with a third base material formed by melting at least one of the first base material and the second base material.

7. The method according to claim 6, wherein an ultraviolet laser, a $CO_2$ laser, or a YAG laser is used as the laser light.

8. The method according to claim 6, wherein the side surface of the first stacked film and the second stacked film, which is exposed by the cutting, is irradiated with the laser light, and the side surface of the first adhesive layer and the second adhesive layer is sealed with the first base material and the second base material.

9. The method according to claim 6, wherein the stacked body has an antenna.

10. The method according to claim 6, wherein the side surface of the first stacked film and the second stacked film, which is exposed by the cutting, is irradiated with the laser light at an incident angle of 30° or more and 80° or less.

11. A method for manufacturing a semiconductor device, comprising the steps of:
adhering a first stacked film including a first base material and a first adhesive layer so as to cover one surface of a stacked body including an integrated circuit;
sealing the stacked body by adhering a second stacked film including a second base material and a second adhesive layer so as to cover the other surface of the stacked body;
cutting the first stacked film and the second stacked film by using a dicer, a laser or a wire saw so that a side surface of the first stacked film and the second stacked film is exposed, after the step of sealing; and
irradiating the side surface of the first stacked film and the second stacked film with a laser light so that a side surface of the first adhesive layer and the second adhesive layer is sealed with a third base material formed by melting at least one of the first base material and the second base material.

12. The method according to claim 11, wherein an ultraviolet laser, a $CO_2$ laser, or a YAG laser is used as the laser light.

13. The method according to claim 11, wherein the side surface of the first stacked film and the second stacked film, which is exposed by the cutting, is irradiated with the laser light, and the side surface of the first adhesive layer and the second adhesive layer is sealed with the first base material and the second base material.

14. The method according to claim 11, wherein the stacked body has an antenna.

15. The method according to claim 11, wherein the side surface of the first stacked film and the second stacked film, which is exposed by the cutting, is irradiated with the laser light at an incident angle of 30° or more and 80° or less.

* * * * *